United States Patent
Yamauchi et al.

(10) Patent No.: US 6,552,959 B2
(45) Date of Patent: Apr. 22, 2003

(54) SEMICONDUCTOR MEMORY DEVICE OPERABLE FOR BOTH OF CAS LATENCIES OF ONE AND MORE THAN ONE

(75) Inventors: Tadaaki Yamauchi, Hyogo (JP); Junko Matsumoto, Hyogo (JP); Takeo Okamoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/118,011

(22) Filed: Apr. 9, 2002

(65) Prior Publication Data

US 2002/0191479 A1 Dec. 19, 2002

(30) Foreign Application Priority Data

Jun. 18, 2001 (JP) ........................................ 2001-183428

(51) Int. Cl.[7] .................................................. G11C 8/00
(52) U.S. Cl. .................................. 365/233; 365/189.05
(58) Field of Search ............................ 365/233, 189.05

(56) References Cited

U.S. PATENT DOCUMENTS

| 5,768,213 | A | * | 6/1998 | Jung et al. | 365/233 |
|---|---|---|---|---|---|
| 6,061,296 | A | * | 5/2000 | Ternullo et al. | 365/233 |
| 6,125,064 | A | * | 9/2000 | Kim et al. | 365/233 |
| 6,166,990 | A | * | 12/2000 | Ooishi et al. | 365/233 |
| 6,246,614 | B1 | | 6/2001 | Ooishi | 365/191 |

FOREIGN PATENT DOCUMENTS

| JP | 4-326270 | 11/1992 |
|---|---|---|
| JP | 7-307090 | 11/1995 |
| JP | 7-326189 | 12/1995 |
| JP | 9-106670 | 4/1997 |
| JP | 9-251774 | 9/1997 |
| JP | 10-162572 | 6/1998 |
| JP | 11-203859 | 7/1999 |
| JP | 11-213668 | 8/1999 |
| JP | 11-297097 | 10/1999 |
| JP | 2000-21198 | 1/2000 |
| JP | 2000-182399 | 6/2000 |
| JP | 2000-200481 | 7/2000 |
| JP | 2000-215663 | 8/2000 |
| JP | 2000-251473 | 9/2000 |
| JP | 2001-6359 | 1/2001 |
| JP | 2001-23371 | 1/2001 |
| JP | 2001-35168 | 2/2001 |

OTHER PUBLICATIONS

U.S. patent application Ser. No. 09/205,586, filed Dec. 4, 1998.

* cited by examiner

Primary Examiner—Richard Elms
Assistant Examiner—Jung H. Hur
(74) Attorney, Agent, or Firm—McDermott, Will & Emery

(57) ABSTRACT

A repeater circuit, operative in response to a clock signal transmitted from an internal clock generation circuit on a clock signal line, outputs one of first and second clock signals depending on whether a CAS latency of one or that of two is applied. The first clock signal pulses twice for activation within the period of an external clock. An input/output circuit, for the CAS latency of no less than two, stores read data in response to the second clock signal attaining the active state, and for the CAS latency of one, stores read data in response to the first clock signal and an equalization signal each attaining the active state.

8 Claims, 18 Drawing Sheets

SEMICONDUCTOR MEMORY DEVICE OPERABLE FOR BOTH OF CAS LATENCIES OF ONE AND MORE THAN ONE

BACKGROUND OF THE INVENTION

1. Field of the Invention

The present invention relates generally to configurations of semiconductor memory devices and particularly to those controlling a timing of an operation thereof.

2. Description of the Background Art

Dynamic random access memory (DRAM) and other similar semiconductor memory devices have been improved to operate more rapidly for example to access data in a short period of time as the system used, such as a personal computer, has been improved to operate more rapidly.

For example, a semiconductor memory device has been put to practical use to provide an increased operating speed. It is a so-called synchronous semiconductor memory device, such as synchronous dynamic random access memory (SDRAM), operating in synchronization with an externally applied clock signal.

For such a synchronous semiconductor memory device, for example in a plurality of semiconductor memory devices incorporated on a board a signal can be read or taken in in response to a clock. Thus an effect for example of a skew of a signal can be alleviated to achieve a rapid operation.

Meanwhile in recent years semiconductor memory devices are increasingly applied for example to a so-called "palm device" and other similar mobile terminals. Such mobile terminals, operating on a battery, are required to operate with small power consumption, as well as operate rapidly.

As such, if a semiconductor memory device manufactured to correspond to a system of a rapid operation, as described above, is used for example in a mobile terminal, it does not necessarily operate at high frequencies.

If the semiconductor memory device has a specification to operate in synchronization with an external clock signal to accommodate such a rapid operation as described above and the clock signal reduces in frequency, the device's access time or the like can be unnecessarily reduced.

Hereinafter this disadvantage will be described more specifically.

FIG. 17 is timing plots for illustrating a read operation in a conventional synchronous semiconductor memory device.

At a time t1 the semiconductor memory device receives a read command DR for the sake of illustration.

If the device is a synchronous semiconductor memory device accommodating a rapid operation it starts outputting data through data input/output terminal DA at a time to, or two clocks after the read command is applied with a clock signal CLK transitions from low to high. Such a time elapsing after read command DR is applied and before read data is output externally from a semiconductor memory device, is referred to as a "CAS latency (CLK)." For example, data is output two clocks after for a CAS latency of two.

Furthermore, such a CAS latency can be set to have a different value depending on a designation provided by a combination of control signals externally applied to a semiconductor memory device, or a mode register set. For example, FIG. 17 also represents a timing of outputting data for a CAS latency of three. In this example, when read command DR is applied and a three clocks then elapses and a time TM3 is thus arrived at, read data is output from the semiconductor memory device.

If when read command DR is applied and a predetermined number of clocks then elapses before read data is read out, the data is read in the following operation:

More specifically, applying read command DR is preceded by selecting a row in a memory cell array and starting reading data from a plurality of memory cells of the selected row, and a temporal period corresponding to a CAS latency can be afforded before read command DR triggers an operation related to a column of the semiconductor memory device, i.e., before an operation is started to read the data of the read row that corresponds to a selected column of the memory cell array and output the data externally from the semiconductor memory device.

Thus if a clock frequency is high, the device can output data in synchronization with the clock signal CLK.

Such a CAS latency is defined to be a number of clocks in accordance with a rapid clock frequency operation when it is designed.

FIG. 18 represents an operation in waveform of such a synchronous semiconductor memory device when it is operated in synchronization with a slower clock signal CLK.

As has been described previously, at time t1 when clock signal CLK transitions from low to high, read command DR is applied. For a CAS latency of two or three, the devise outputs data when time t1 is followed by two or three clocks and time TM3 or to is thus arrived at.

If clock signal CLK has a low frequency, the device does not require the CAS latency of two and it can output read data for which a column related operation is started at time t1, for example before time t1 is followed by one clock and time to is thus arrived at. Thus, if the device operates in synchronization with clock signal CLK of such a low frequency, it can externally output read data for example with a CAS latency of one or one clock after read command RD.

Thus if the device is assumed to be used in a system such as a mobile terminal, it is required to be capable of operation with the CAS latency of one which is not assumed in a rapid operation.

However, if a semiconductor memory device operable conventionally with a CAS latency of two or three is simply provided with a circuit in a different system to control a timing and it is thus also operable with the CAS latency of one, it would have a disadvantageously increased circuit area.

SUMMARY OF THE INVENTION

The present invention contemplates a semiconductor memory device operable with both a CAS latency of one and that of more than one and having a timing control configuration preventing the device from further increasing in circuit area.

The present invention generally provides a semiconductor memory device synchronized with an external clock signal to input a command and input and output data, including: a control circuit controlling an operation of the semiconductor memory device; a memory cell array including a plurality of memory cells arranged in rows and columns; an internal clock circuit operative in response to the external clock signal to generate an internal clock signal; a clock signal line transmitting the internal clock signal; a clock conversion circuit receiving the internal clock signal on the clock signal line and driven by which one of first and second modes of operation is designated to output one of first and second clock signals based on the internal clock signal, the first mode of operation allowing starting reading data from the semiconductor device one clock after a read command is applied when the external clock signal has a first transition for activation, the second mode of operation allowing starting reading data from the semiconductor device two clocks after the read command is applied when the external clock signal has the first transition for activation, the second clock signal in the second mode of operation being equal in frequency to the external clock and being synchronized with the external clock, the first clock signal in first mode of operation pulsing twice for activation within a period of the internal clock signal; a data bus transmitting data read from the memory cell array; an equalization circuit operative in response to an equalization signal to equalize the data bus; a command signal line transmitting the equalization signal from the control circuit; a data input/output terminal; and an input/output circuit outputting to the data input/output terminal the read data transmitted on the data bus, the input/output circuit including a latch circuit operative in the second mode of operation to store and hold the read data therein in response to the second clock signal attaining an active state, and operative in the first mode of operation to store and hold the read data therein in response to the first clock signal and the equalization signal each attaining an active state.

Preferably, the memory cell array includes a plurality of bit lines each provided to correspond to the column of memory cells to transmit data from a corresponding memory cell, a plurality of sense amplifiers enabled by a sense amplifier enable signal to amplify a potential of the bit line, and a column select circuit enabled by a column select enable signal to select the column of memory cells selected in response to an external address signal, and the control circuit activates the column select enable signal in response to one of external read and write commands being applied the sense amplifier enable signal also having an active state.

Thus the present invention has a main advantage that in both of a first mode of operation allowing starting reading data one clock after a read command is applied when an external clock signal has a first transition for activation and a second mode of operation allowing starting reading data two clocks after the read command is applied when the external clock signal has the first transition for activation, the device can output data, as timed without delay, and also avoid having a further increased circuit area.

The present invention has another advantage that the device can output data, as timed without delay, if an external dock signal has a period larger than its design specification.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
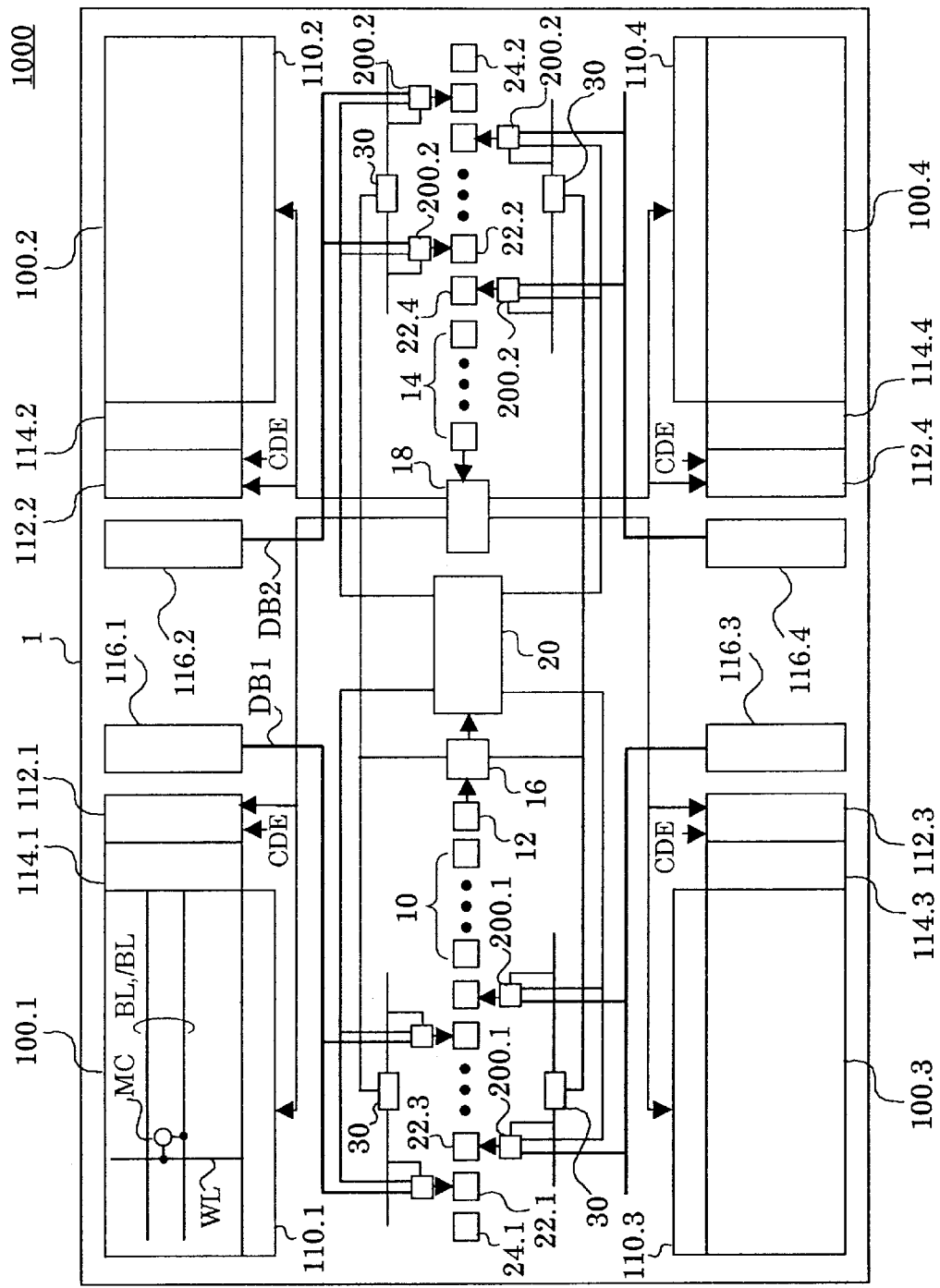
FIG. 1 is a block diagram schematically showing a configuration of a semiconductor memory device 1000 of a first embodiment of the present invention.

FIG. 1 is a block diagram schematically showing a configuration of a semiconductor memory device 1000 of a first embodiment of the present invention.

As shown in FIG. 1, semiconductor memory device 1000 is fabricated on a semiconductor substrate 1 and includes four memory mats 100.1 to 100.4. The semiconductor memory device 1000 chip has a center with a pad group receiving external data, control signals and the like, a circuit responsible for generally controlling the operation of the chip, and the like arranged.

More specifically, semiconductor memory device 1000 has a main surface with an integrated circuit fabricated thereon, and rectangular semiconductor substrate 1 has one longer side along which memory array mats 100.1 and 100.2 are arranged and semiconductor substrate 1 has the other longer side along which memory array mats 100.3 and 100.4 are arranged. Memory array mats 100.1 and 100.2 and memory array mats 100.3 and 100.4 surround a region CR provided with an external control signal input terminal group 10 receiving external control signals, a clock signal input terminal 12 receiving an external clock signal, an address signal input terminal group 14 receiving an external address signal, an internal clock generation circuit 16 generating internal clock signals CLK and CLKQ in response to an external clock signal ext. CLK applied through clock signal input terminal 12, an address input buffer 18 receiving an address signal through address signal input terminal group 14 and outputting an internal address, and a central control circuit 20 receiving an external control signal such as a read signal RD, a write signal WT, a row address strobe signal RAS and a column address strobe signal CAS received at control signal input terminal group 10 and a clock signal from internal clocks generation circuit 16 to generate an internal control signal to control an operation effected in semiconductor memory device 1000.

Furthermore, memory array mat 100.1 includes a plurality of memory cells MCs arranged in rows and columns and for a memory cell row a word line WL is provided to select a memory cell column and for a memory cell column a pair of bit lines BL, /BL is provided to transmit data from a selected memory cell.

Semiconductor memory device 1000 includes a row decoder 110.1 corresponding to memory array mat 1000.1 and operative in response to an address signal received from address buffer 18 to select a memory cell row (a word line) in memory array mat 100.1, a column decoder 112.1 operative in response to an internal address signal received from address buffer 18 to select a memory cell column (a bit line pair) in memory array mat 100.1, a sense amplifier receiving through each bit line pair BL, /BL and amplifying the data read from memory cell MC of a memory cell row selected by row decoder 110.1, and a select gate circuit reading data from a memory cell column selected by column decoder 112.1. Hereinafter, the sense amplifier and the select gate circuit will generally be referred to as a sense amplifier/select gate circuit 114.1.

Semiconductor memory device 1000 further includes a read amplifier 116.1 receiving read data from sense amplifier/select gate 114.1 and transmitting the read data to a data bus DB1. The data output by read amplifier 116.1 onto data bus DB1 is transmitted on data bus DB1 to a data input/output circuit 200.1.

Data input/output circuit 200.1 receives via a repeater circuit 30 internal clock signal CLKQ output from internal clock generation circuit 16. Input/output circuit 200.1 is synchronized with the internal clock signal received from repeater circuit 30 and operative in response to a control signal received from central control circuit 20 to output read data to a data input/output terminal 22.1 corresponding thereto.

Note that, as will be described hereinafter, outputting data from data input/output terminal 22.1 is prohibited by a data mask signal DAM applied through a mask signal input terminal 24.1.

Memory array mat 100.3 has a configuration similar to that of memory array mat 100.1.

Furthermore, for memory array mats 100.2 and 100.4, as well as memory cell mats 100.1 and 100.3 there are provided a data input/output terminal 22.2 and a data mask signal input terminal 24.2, a data input/output circuit 200.2, a repeater circuit 30 transmitting an internal clock signal, and the like.

First Configuration Applied to Establish Both Operation with CAS Latency of Two (or Three) and That with CAS Latency of One.

Figure 2:
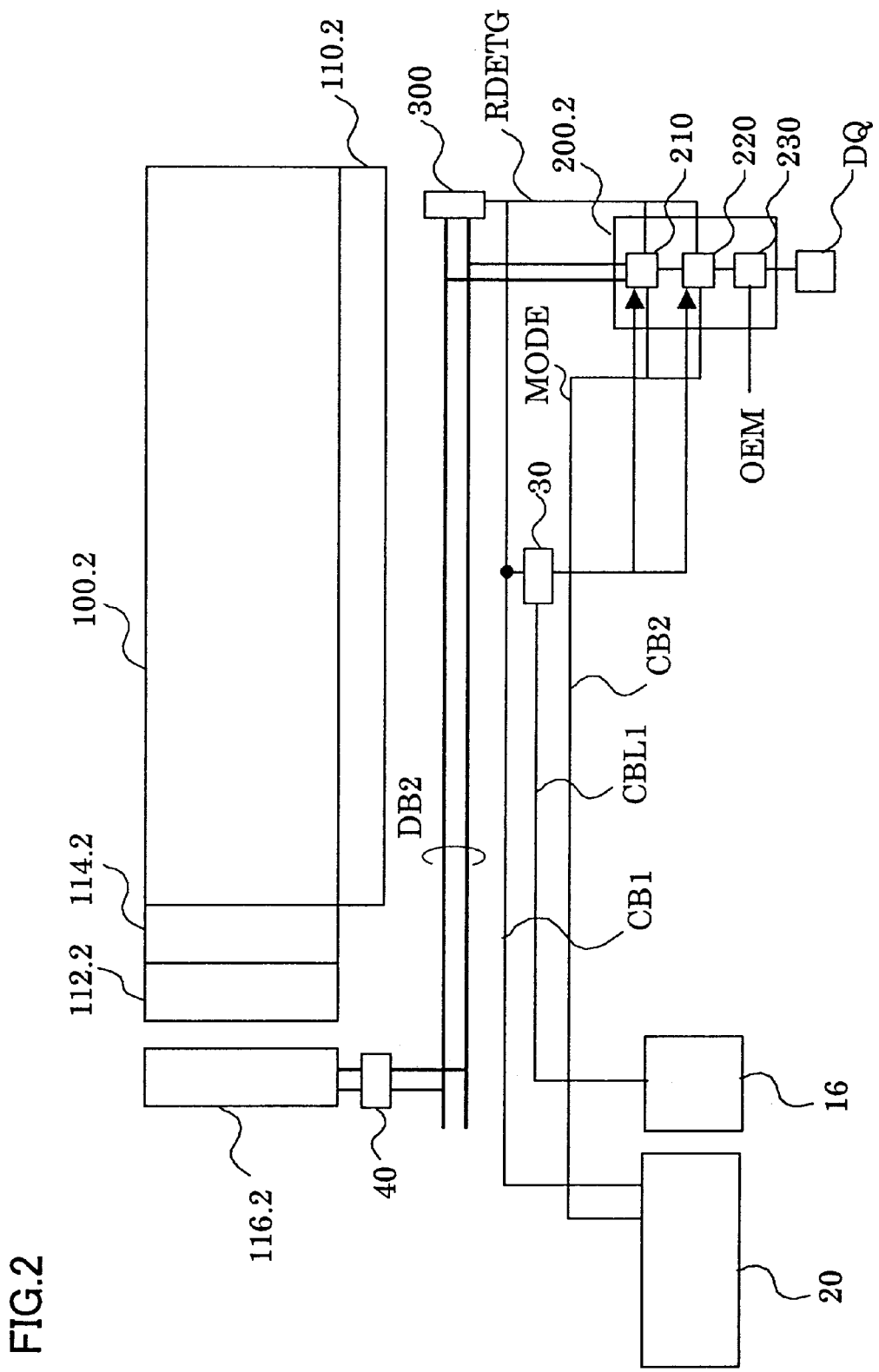
FIG. 2 is a block diagram schematically showing a first example of a configuration establishing both an operation with a CAS latency of one and that with a CAS latency of two (or three)

FIG. 2 is a block diagram schematically showing a first example of a configuration allowing the FIG. 1 semiconductor memory device 10000 to operate in response to both a clock signal of a relatively low frequency or with a CAS latency of one and a clock signal of a high frequency or with a CAS latency of two (or three), as has been described above.

A CAS latency is set, as designated by a combination of an external control signal, an address signal and the like, and central control circuit 20 stores which CAS latency is set for the sake of illustration.

FIG. 2 shows a configuration corresponding to one data input/output terminal DQ extracted from data input/output terminal group 22.2 corresponding to memory array mat 100.2 shown in the FIG. 1 configuration.

With reference to FIG. 2, a latch circuit 40 holds data read from memory array mat 100.2 via read amplifier 116.2 and transmits the read data on a complimentary data bus DB2 to data input/output circuit 200.2. From read amplifier 116.2 and then latch circuit 40 to data input/output circuit 200.2, data is not transmitted in a signal of a large amplitude varying between a ground potential and an internal power supply potential Vcc in full swing but in a signal of a smaller amplitude to allow the data to be transmitted rapidly. Latch circuit 40 is controlled by central control circuit 20 to control when to transmit read data to data bus DB2 in response to which of an operation with a CAS latency of two or that with a CAS latency of three has been designated,.

In data input/output circuit 200.2 a first latch circuit 210 is operative in response to a control signal RDETG received from central control circuit 20 that is activated (or transitions to a high level), to convert the data small in amplitude received on data bus DB2 to data of a large amplitude and hold it.

When latch circuit 210 completes its latch operation, signal RDETG transmitted from central control circuit 20 on a command signal line CB1 controls equalization circuit 300 to equalize a level of data bus DB2 for preparation of subsequent data transmission. In other words, latch circuit 210 allows data transmission from read amplifier 116.2 and then latch circuit 40 and then on data bus DB2 to be provided by a pipe line operation.

The data latched by latch circuit 210 is further latched by a latch circuit 220 in response to a clock signal output from repeater circuit 30, and latch circuit 220 and output buffer 230 output their latched data to data input/output terminal DQ in response to an output enable signal OEM output from central control circuit 20 that attains an active state and an internal clock signal output from repeater circuit 30 that attains an active state. That is, latch circuit 220 holds data to be immediately output.

Internal clock signal CLKQ fed via repeater circuit 30 and an operation of central control circuit 20, as described above, are adapted to control the operation with the CAS latency two (or three).

In order for a such a configuration to allow the operation with the CAS latency of one (hereinafter referred to as an operation CL1), for example internal clock generation circuit 16 is driven by a magnitude of a CAS latency to adjust a period of clock signal CLKQ transmitted to data input/output circuit 200.1, to allow the operation with the CAS latency of one by providing a clock signal in a different system.

More specifically, as shown in FIG. 2, repeater circuit 30 receives a clock signal from internal clock generation circuit 16 through a clock signal line CBL1 and repeater circuit 30 transmits internal clock signal CLKQ to data input/output circuit 200.2 for the CAS latency of two (or three). To allow the operation with the CAS latency of one, internal clock generation circuit 16 transmits a clock signal to repeater circuit 30 through a clock signal line CBL2 different from clock signal line CBL1 and repeater circuit 30 transmits an internal clock signal CLKQ1 to data input/output circuit 200.2 for the CAS latency of one.

In other words, the operation for the CAS latency of two or three only requires that a pipe line operation allow latch circuits 210 and 220 to store data in synchronization with signal RDETG and clock signal CLKQ having a transition each for activation.

By contrast, using the same circuit configuration to provide the operation with the CAS latency of one requires that within the same clock cycle as read command RD is applied, read data be transmitted from read amplifier 116.2 to latch circuit 220 and the device also start at putting data to data input/output terminal DQ. As such, the operation with the CAS latency of one requires that latch circuits 210 and 220 be controlled a by a timing of a clock that is different than the CAS latency of two (or three).

By contrast, if the operation with the CAS latency of two can be provided, then that with the CAS latency of three can be provided for example simply by delaying a timing at which latch circuit 220 outputs data to data input/output terminal DQ.

Such a variation in mode of operation of latch circuits 210 and 220 and the like is controlled by a signal MODE transmitted on a command signal line CB2.

Thus, to allow an operation for a CAS latency of one while simply using a reading circuit allowing a conventional CAS latency of two or three, clock signal line CBL1 is required to transmit a clock of a different system, as described above.

The FIG. 2 configuration, however, has a disadvantage, as described below:

More specifically, as has been described with reference to FIG. 1, memory array mats 100.1 and 100.2 and memory array mats 100.3 and 100.4 surround a chip's central portion CR with address, command, data and clock buses and many other similar signal lines arranged therein for signal transmission.

As such, the chip area would be increased if clock signal line CBL1 is required to allow the operation with the CAS latency of one.

In particular, a clock signal directly affects a rate of a data input/output operation and clock signal line CBL1 is required to be a line of a low resistance, i.e., an overlying metallic interconnection in a multilevel interconnection, e.g., an aluminum interconnection layer.

In general, if an interconnection is situated upper in a multilevel interconnection, its interval, as allowed by a design rule, is hardly reduced.

As such it is disadvantageous in designing a circuit if in such a metal interconnection layer an additional interconnection needs to be introduced.

Figure 3:
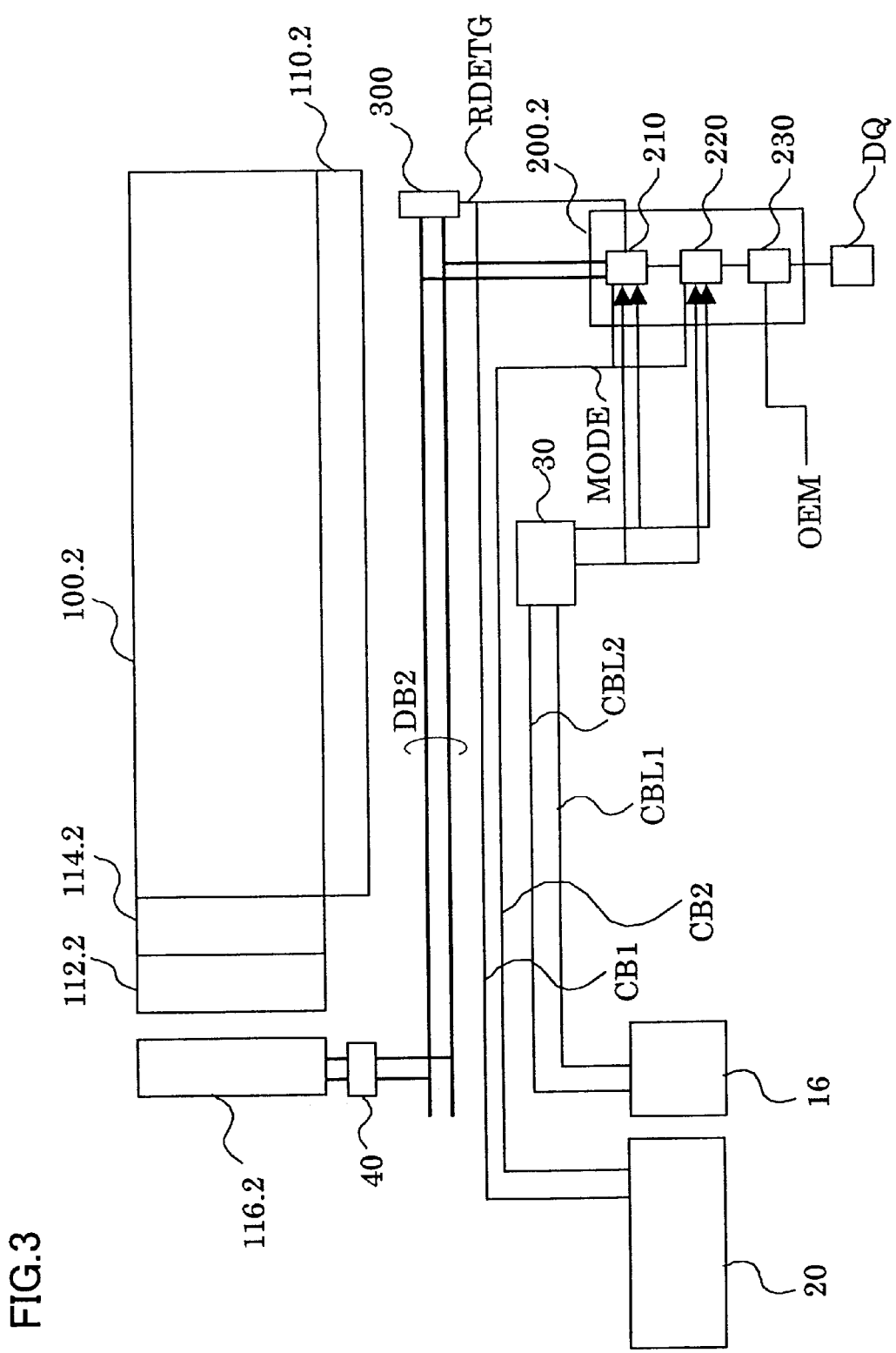
FIG. 3 is a block diagram schematically showing a circuit configuration overcoming such a disadvantage as described in FIG. 2.

Second Configuration Establishing Both Operation with CAS Latency of Two (or Three) and That with CAS Latency of One FIG. 3 is a block diagram schematically showing a circuit configuration overcoming such a disadvantage as described with reference to FIG. 2.

FIG. 3 differs from FIG. 2 in that internal clock signal CLKQ is transmitted from internal clock generation circuit 16 to repeater circuit 30 on signal line CBL1 alone. To compensate therefor, data input/output circuit 200.2 includes latch circuit 220 also receiving signal RDETG on command signal line CB1 to instruct equalization circuit 300 to equalize data bus DB2.

Furthermore, as will be described hereinafter, repeater circuit 30 also receives signal RDETG and repeater circuit 30 in a CAS latency mode converts internal clock signal CLKQ.

As will be apparent from the following description, in the FIG. 3 configuration for the CAS latency of one clock signal CLKQ is converted to further superimpose on clock signal CLKQ transmitted for the CAS latency of two (or three) from internal clock generation circuit 16 to repeater circuit 30 a pulse attaining an active state within a single cycle of a clock signal for the CAS latency of two (or three).

Latch circuit 220 is operative in response to mode signal MODE received from central control circuit 20 on command signal line CB2, to change a mode of an operation synchronized with clock signal CLKQ output from repeater circuit 30.

Mode signal MODE is simply a signal provided to designate a mode of operation of latch circuit 220 and it is not required to be transmitted from central control circuit 20 rapidly. Signal line CB2 is not required to be a metallic interconnection such as clock signal line CBL1 transmitting a clock signal, command signal line CB1 transmitting a data bus equalization signal, and the like. For example, mode signal MODE can be transmitted on an underlying, polysilicon interconnection.

Thus the mode signal is transmitted on command signal line CB2 underlying a metallic interconnection layer.

In other words, the FIG. 3 configuration has a number of interconnection layers required to be of metal that is smaller by one than the FIG. 2 configuration.

Figure 4:
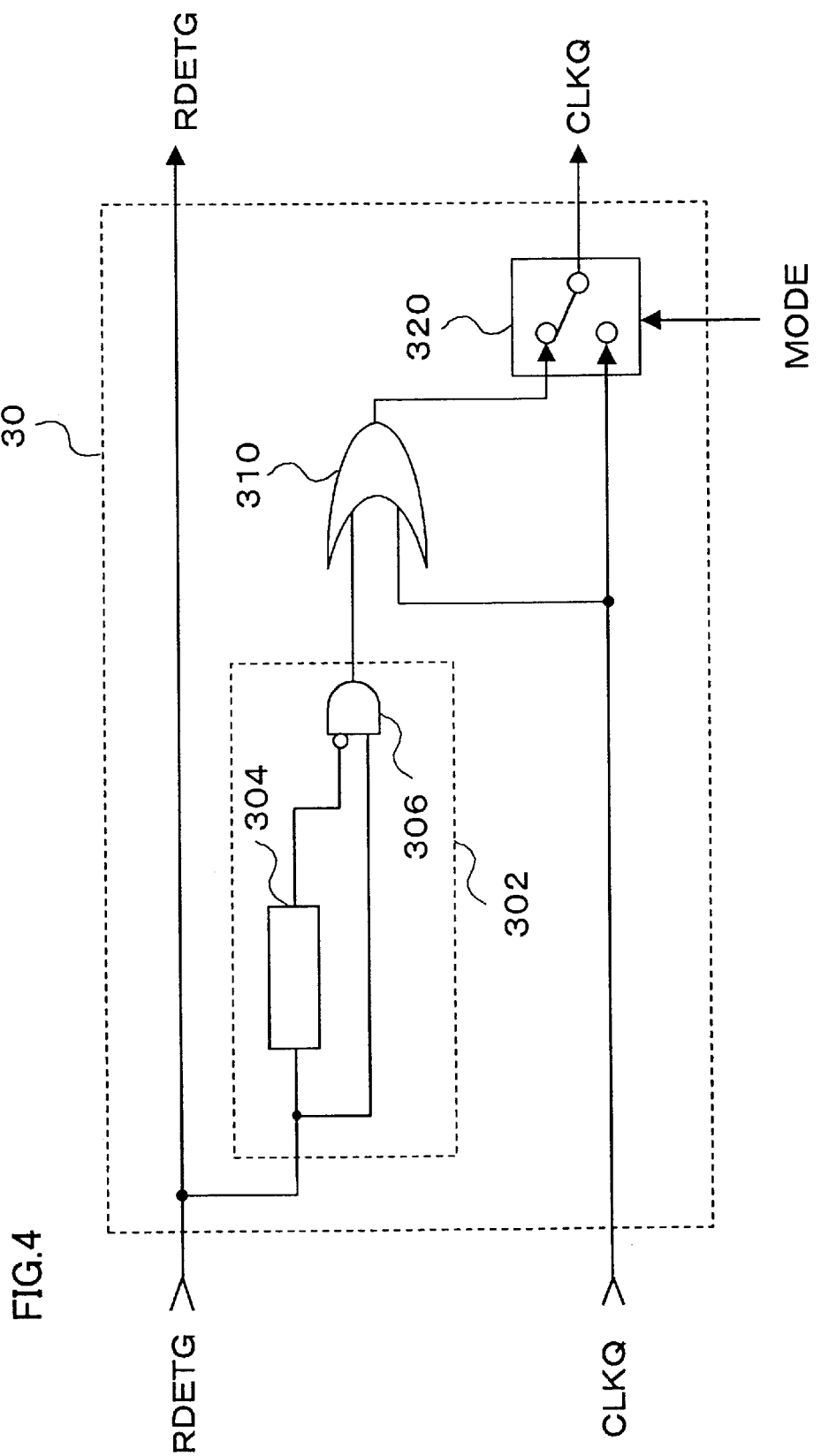
FIG. 4 is a schematic block diagram for illustrating a configuration of a clock buffer provided in an internal clock generation circuit 16.

FIG. 4 is a schematic block diagram for illustrating a configuration of the FIG. 3 repeater circuit 30.

Internal clock generation circuit 16, as will be described hereinafter, generates a one-shot pulse in response to a low to high transition of external clock signal ext. CLK. A signal configured by this one shot pulse is used as signal CLK. In response to signal CLK internal clock generation circuit 16 generates internal clock signal CLKQ to control an operation for example of latch circuit 210.

The FIG. 4 repeater circuit 30 includes a one shot pulse circuit 302 receiving signal RDETG and generating a one shot pulse in response to the signal attaining the active state, an OR circuit 310 receiving an output of one shot pulse circuit 302 and internal clock signal CLKQ output from internal clock generation circuit 16, and a switch circuit 320 receiving an output of OR circuit 310 and internal clock signal CLKQ from internal clock generation circuit 16 and responsive to signal MODE to select one of the OR circuit 310 output and internal clock signal CLKQ for output for example to latch circuit 220 as internal clock signal CLKQ.

One shot pulse circuit 302 includes a delay circuit 304 receiving signal RDETG and delaying the signal for a predetermined period of time, and a logic gate 306 outputting a logical product of an inverted level of an output of delay circuit 304 and signal RDETG.

Switch circuit 320 for the CAS latency of two or three selects internal clock signal CLKQ received from internal clock generation circuit 16 and outputs it as clock signal CLKQ and for the CAS latency of one outputs the output of OR circuit 310 as clock signal CLKQ.

Figure 5:
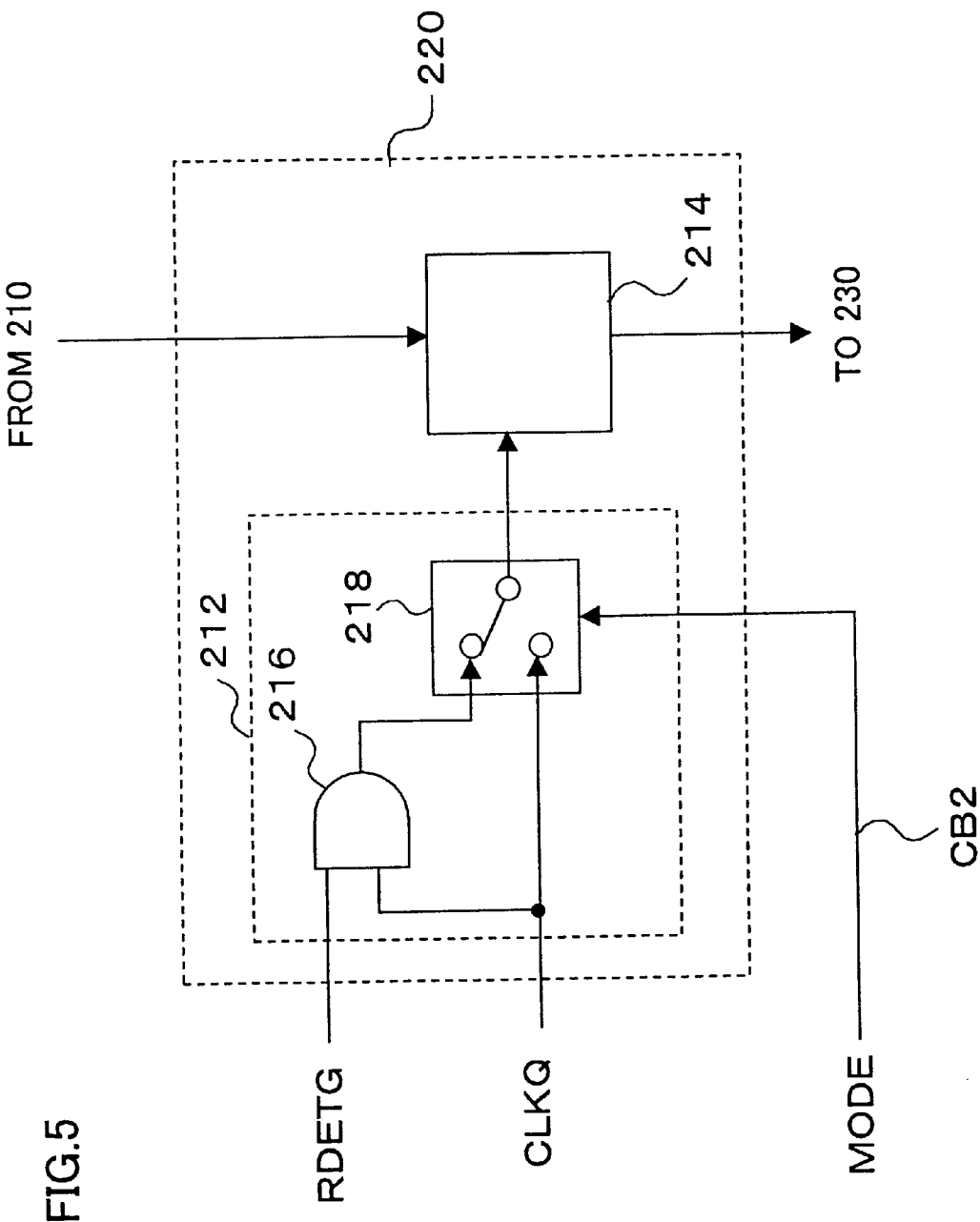
FIG. 5 is a schematic block diagram for illustrating a configuration of a latch circuit 220, as has been described in FIG. 3.

FIG. 5 is a schematic block diagram for illustrating a configuration of latch circuit 220 as described with reference to FIG. 3.

Herein initially latch circuit 210 holds a signal transmitted on data bus DB2 when control signal RDETG is activated.

The FIG. 5 latch circuit 220 includes a clock conversion circuit 212, and a data hold circuit 214 controlled by an output of clock conversion circuit 212 to hold a signal fed from latch circuit 210.

Clock conversion circuit 212 includes an AND circuit 216 having one input receiving clock signal CLKQ from repeater circuit 30 and having the other input receiving data bus equalization signal RDETG provided to equalization circuit 300, and a switch circuit 218 receiving clock signal CLKQ and an output of AND circuit 216 and outputting one of clock signal CLKQ and the AND circuit 216 output to data hold circuit 214 in response to a mode signal transmitted on command signal line CB2.

In other words, switch circuit 218 for a mode of operation with the CAS latency of two (or three) transmits the exact clock signal CLKQ from repeater circuit 30 to data hold circuit 214.

By contrast, switch circuit 218 for the CAS latency of one feeds the output of AND circuit 216 to data hold circuit 214.

Figure 6:
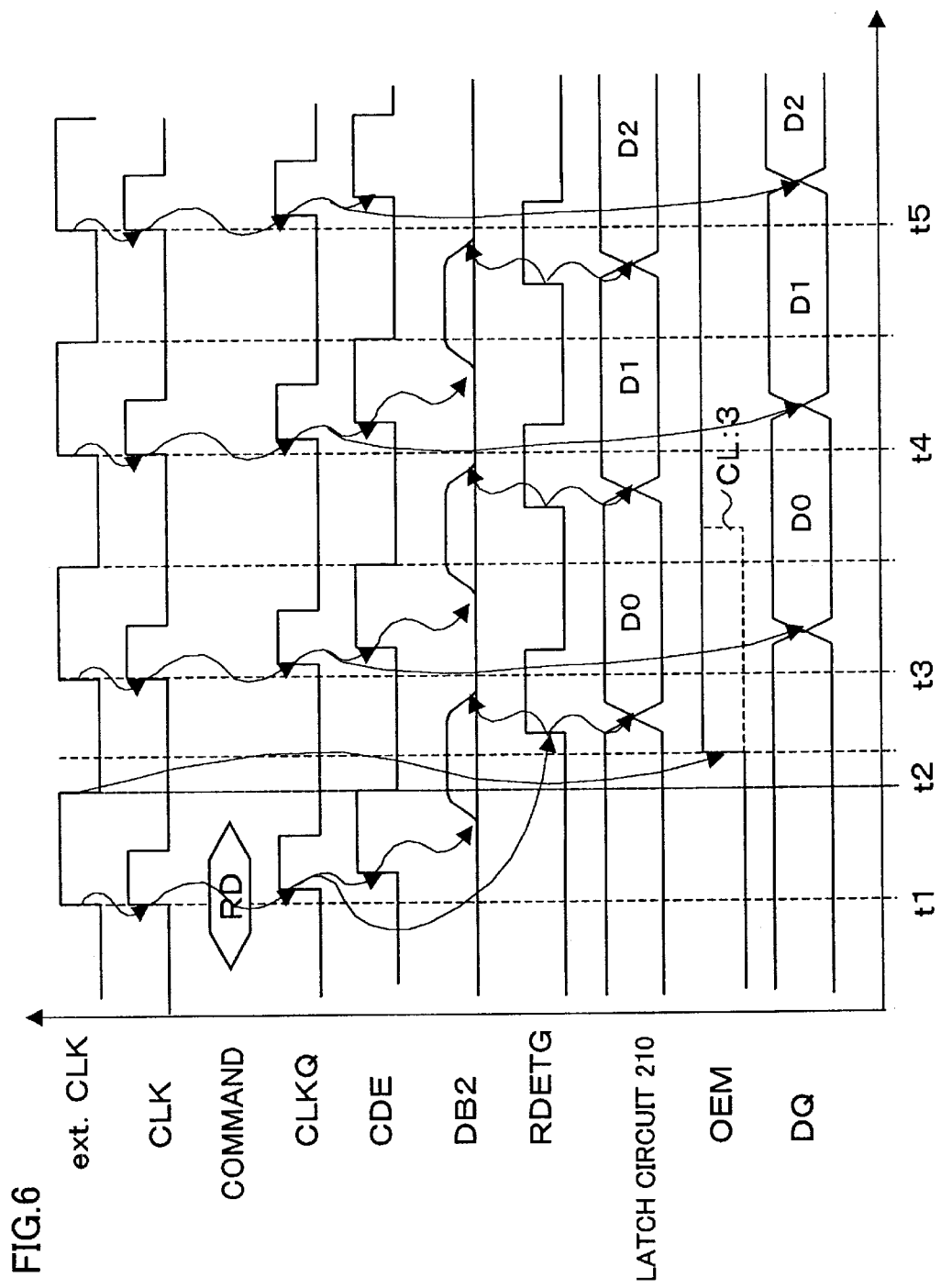
FIG. 6 is timing plots for illustrating an operation reading data from the FIG. 3 circuit for a CAS latency of two.

FIG. 6 is timing plots for illustrating an operation reading data from the FIG. 3 circuit for the CAS latency of two.

Initially at time t1 external clock signal ext. CLK transitions from low to high and internal clock generation circuit 16 correspondingly generates clock signal CLK. Signal CLK transitions high and corresponding thereto internal clock signal CLKQ transitions from low to high and in response thereto column decoder enable signal CDE is activated to select a memory cell column and data D0 is transmitted from read amplifier 116.2 and then latch circuit 40 to data bus DB2.

When there elapses a period of time elapsing after internal clock CLKQ has a low to high transition corresponding to that of signal CLK at time of t1 and before data t0 is read on data bus DB2, central control circuit 20 outputs signal RDETG having an active state. In response to signal RDETG after data D0 is taken in to latch circuit 210 data bus DB2 has its potential equalized.

At time to external clock signal ext. CLK transitions from high to low and in response thereto output enable signal OEM is activated (or attains a high level) to permit latch circuit 220 and output buffer 230 to output data.

Subsequently at time t3 clock signal CLK transitions for activation and in response thereto plus a delay of a predetermined period of time signal CLKQ is activated and thereby column decoder enable signal is again activated to select a memory cell column to transmit data from read amplifier 116.2 and then latch circuit 40 to data bus DB2. Furthermore, in response to the low to high transition of signal CLKQ corresponding to clock signal CLK activated at time t3 latch circuit 220 receives data from latch circuit 210 and hold the data. The data held by latch circuit 220 is output to data input/output terminal DQ in response to signal OEM having an active state.

Furthermore, in response to the low to high transition of internal clock signal CLKQ corresponding to clock signal CLK transitioning from low to high at time t3 central control circuit 20 again generates signal RDETG to equalize data bus DB2 and after latch circuit 210 stores data D1 therein data bus DB2 has its potential equalized.

Subsequently at time t4 external clock signal ext. CLK transitions from low to high and semiconductor memory device 1000 outputs to an external device data D0 output from latch circuit 220 to data input/output terminal DQ via output buffer 230. Thereafter, data D2 is successively read from a memory cell array and externally read when external clock signal ext. CLK transitions from low to high.

Figure 7:
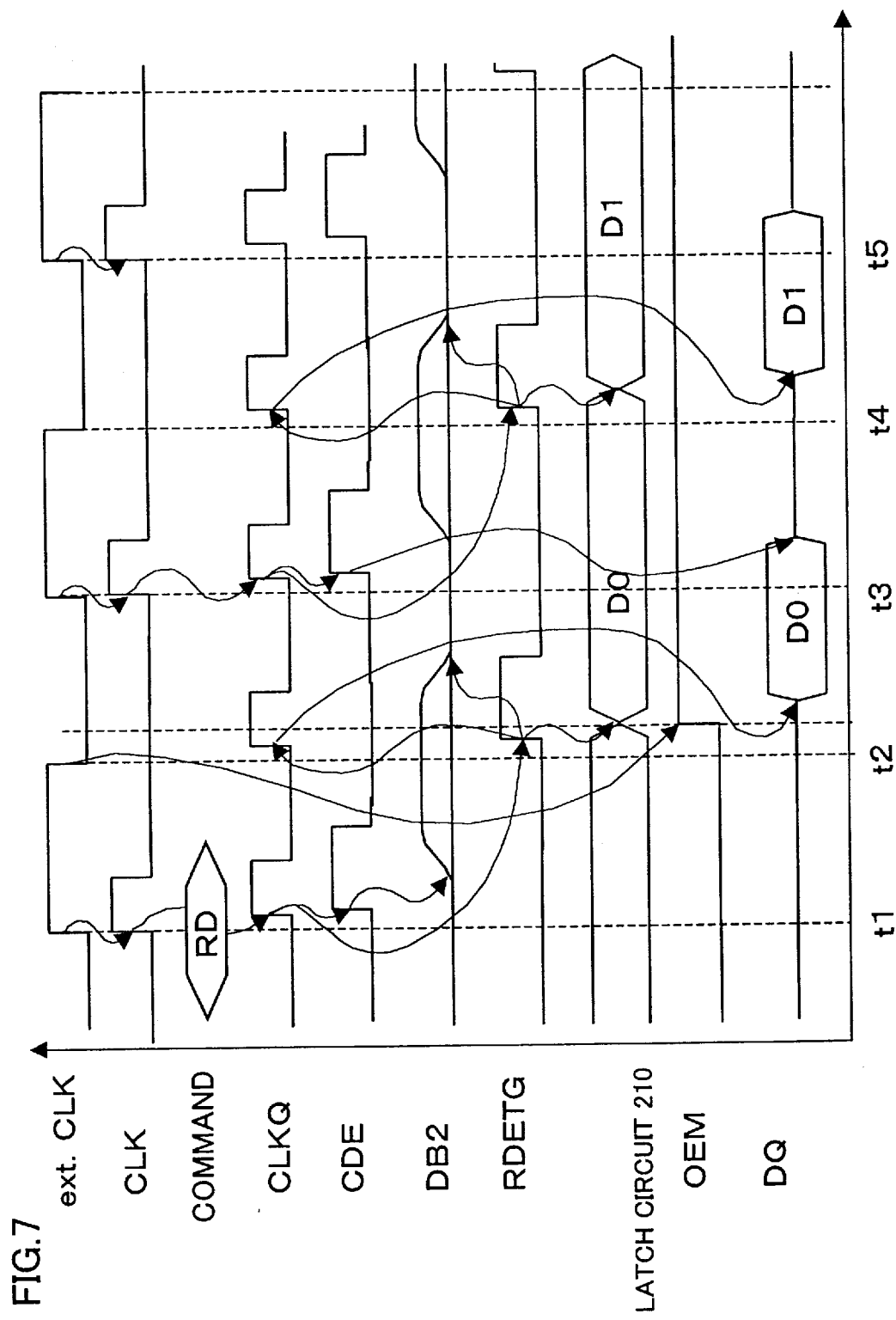
FIG. 7 is timing plots for illustrating a read operation in a FIG. 3, similar circuit configuration for a CAS latency of one.

FIG. 7 is timing plots for illustrating a read operation in a circuit configuration similar to that shown in FIG. 3 for the CAS latency of one.

Also for the CAS latency of one, internal clock generation circuit 16 generates internal clock signal CLKQ from one shot pulse signal CLK generated in response to a low to high transition of external clock signal ext. CLK and outputs internal clock signal CLKQ thus generated. Internal clock signal CLKQ is then inverted by repeater circuit 30 to an internal clock signal CLKQ, as will be described hereinafter. FIG. 7 represents internal clock signal CLKQ thus inverted by repeater circuit 30.

With reference to FIG. 7, at time t1 external clock signal ext. CLK has a low to high transition and corresponding thereto signal CLK transitions for activation and in response thereto repeater circuit 30 outputs internal clock signal CLKQ attaining an active level. In response to internal clock signal CLKQ activated, column decode enable signal CDE is activated and data bus DB2 receives data from read amplifier 116.2.

Furthermore, as well as for the CAS latency of two, as shown in FIG. 6, when there elapses a period of time elapsing after internal clock signal CLKQ has a low to high transition corresponding to signal CLK transitioning from low to high at time t1 and before data D0 is read on data bus DB2, central control circuit 20 output signal RDETG having an active state.

In response to signal RDETG activated, latch circuit 210 holds a signal transmitted on data bus DB2, when in repeater circuit 30 in response to signal RDETG activated a one shot pulse is superimposed on internal clock signal CLKQ received from internal clock generation circuit 16. After this superimposition, data is stored in latch circuit 220 at data hold circuit 214 in response to internal clock signal CLKQ and signal RDETG both having an active state. Then in response to signal RDETG data bus DB2 has its potential level equalized.

At time t2 external clock signal ext. CLK has a high to low transition and in response thereto signal OEM attains an active state (a high level).

The data that latch circuit 220 has received from latch circuit 210 and stored therein is output to data input/output terminal DQ via output buffer 230 in response to signal OEM having the high level. Thus, when time t1 is followed by one clock and at time t3 external clock signal ext. CLK transitions for activation, data input/output terminal DQ outputs data.

Furthermore, in response to external clock signal ext. CLK transitioning at time t3 for activation, output buffer 230 has an output node, i.e., data input/output terminal DQ controlled by an internal control signal output from central control circuit 20 to have a high impedance state.

Thus the input/output circuit's latch circuit 210, output buffer 230 and the like can remain unchanged while simply changing repeater circuit 30 in configuration and providing clock variation circuit 212 controlling a timing of operation for data hold circuit 214 internal to latch circuit 220, can establish both an operation with the CAS latency of two and that with a CAS latency of one.

As has been described previously, command signal line CB2 provided to control clock variation circuit 212 can be formed of a lower interconnection, such as polysilicon, in a multilevel interconnection. Thus it is not necessary to increase the number of signal lines transmitting a clock signal, a data bus equalization signal, and other similar command signals to be transmitted rapidly. In other words, modifying repeater circuit 30 and clock variation circuit 212 can implement semiconductor memory device 1000 capable of establishing both an operation for a CAS latency of one allowing data to be output when an external clock signal first transitioning for activation is immediately followed by external clock signal ext. CLK second transitioning for activation, and an operation for a CAS latency of two (or three) allowing data to be output when clock signal CLK first transitioning for activation is followed by two (or three) clocks.

Configuration Applied to Control Data-masking

As has been described above, if semiconductor memory device 10000 is a synchronous semiconductor memory device operable with the CAS latency of two (or three) and external clock signal CLK has a low frequency, the device can implement the operation for the CAS latency of one without unnecessarily delaying the operation.

In data read and write operations a so-called mask operation can be effected to prohibit reading and writing data from and to a memory cell corresponding to a specific group of data input/output terminals.

In this mask operation, however, data output is masked two clocks after a command DQM indicative of the mask operation is issued whether the current CAS latency is the CAS latency of one or that of two (or three).

As has been described previously, for the CAS latency of two (or three) data output is masked two clocks after command DQM is issued, whereas for the CAS latency of one, data read in the cycle immediately subsequent to a period in which mask command DQM is issued, rather than data read within the exact period in which mask command DQM is issued, needs to be masked.

Thus the data mask operation cannot be timed, as controlled in a single manner for both the CAS latency of one and that of two (or three).

In the FIG. 1 semiconductor memory device 1000 data mask command DQM output from the FIG. 1 data mask signal input terminals 24.1 and 24.2 are transmitted at a timing as controlled to accommodate a mode of operation so as to allow the data mask operation to be operable with a latency of two for both the CAS latency of two (or three) and that of one.

Figure 8:
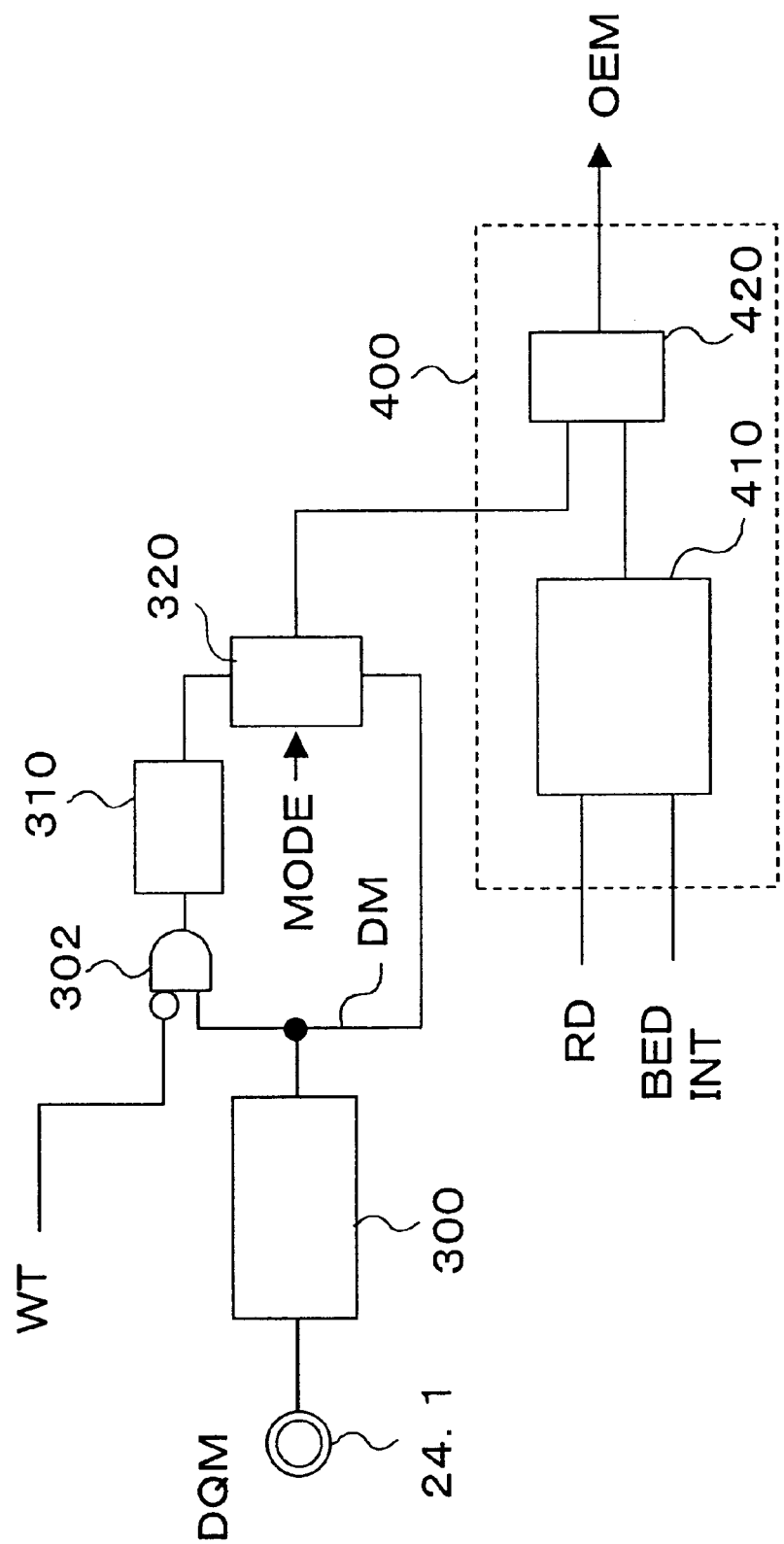
FIG. 8 is a schematic block diagram for illustrating a circuit provided to control a timing of a data mask command DAM.

FIG. 8 is a schematic block diagram for illustrating a circuit provided to control a timing of data mask command DQM.

Mask signal generation circuit 300 receives data from mask signal input terminal 24.1 to generate a mask signal DM. Logic gate 302 outputs a logical product of an inverted level of a write signal WT and a level of signal DM. Furthermore a shifter circuit 310 delays mask signal DM for one clock and outputs mask signal DM thus delayed.

Switch circuit 320 receives an output from shifter circuit 310 and that from mask signal generation circuit 300 and for the CAS latency of one outputs the output of shifter circuit 310 to an OEM signal generation circuit 400 and for the CAS latency of two (or three) outputs the output of mask data generation circuit 300 to OEM signal generation circuit 400. OEM signal generation circuit 400 is provided internal to central control circuit 20.

OEM signal generation circuit 400 includes an output control signal generation circuit 410 activating an output level in response to a read signal RD and inactivating the output level in response to a burst end signal activated, an interrupt signal activated or the like, and a logic circuit 420 receiving an output from output control signal generation circuit 410 and outputting a signal OEM of an inactive level for an active output of switch circuit 320 regardless of the output level of output control signal generation circuit 410 and outputting the output of output control signal generation circuit 410 for an inactive output of switch circuit 320.

That is, when switch circuit 320 outputs mask signal DM having an active state, signal OEM generation circuit 400 holds signal OEM having a level in an inactive state (a low level).

Thus, even for the CAS latency of one, data output after command DQM is issued when a latency of two is applied and also after a two clocks elapses, is masked.

Control of Timing for Read Data Immediately After Write Mask

Figure 9:
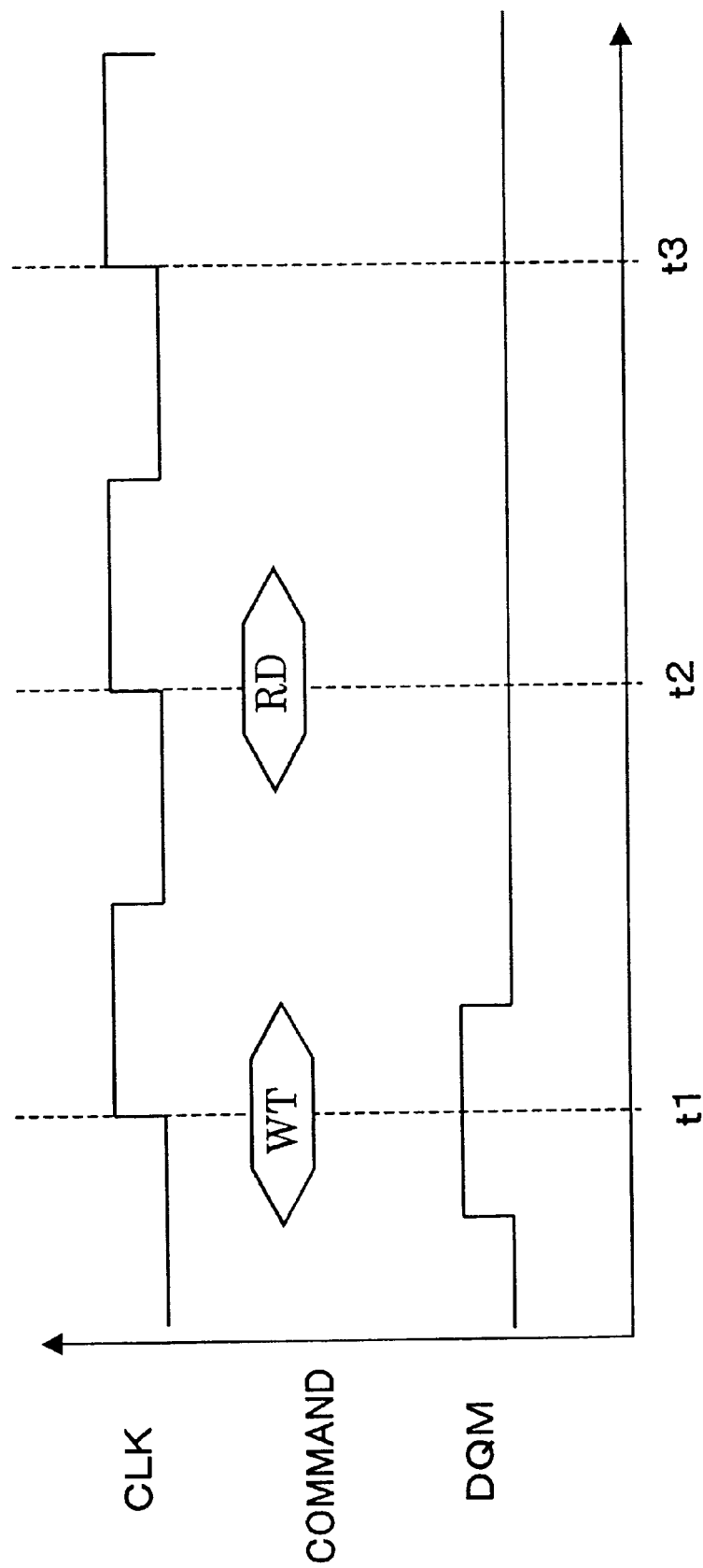
FIG. 9 is timing plots representing one example for the CAS latency of one when mask command DAM is applied with write and read commands.

FIG. 9 is timing plots representing an example for the CAS latency of one when mask command DQM is issued with write and read commands.

At time t1 dock signal CLK transitions from low to high, when the write command is issued and mask command DQM also has an active state.

As has been described previously, mask command DQM designates an operation masking data input and output two clocks after mask command DQM is issued.

In the FIG. 9 example, read command RD is adapted to be issued at time t1 plus one clock, i.e., at time t2.

For the CAS latency of one, read data is externally output at time t2 plus one clock, i.e., at time t3.

As such, if mask command DQM is issued in the FIG. 9 condition, it is not clear whether the command is issued to mask data to be written two clocks after time t1 or data output at time t3.

Herein for example the write command is issued for example for a first one of a plurality of banks and the read command is issued for another one of the plurality of banks for the sake of illustration.

As such, to avoid such a confusion as described above, mask command DQM applied simultaneously with the write command needs to be inactivated.

Accordingly in the FIG. 8 signal OEM generation circuit 400 shifter circuit 310 is preceded by gate logic circuit 302 to prevent the shifter circuit form receiving an output from mask signal generation circuit 300 when the write command has an active state.

Control of Timing of Output Control Signal

Figure 10:
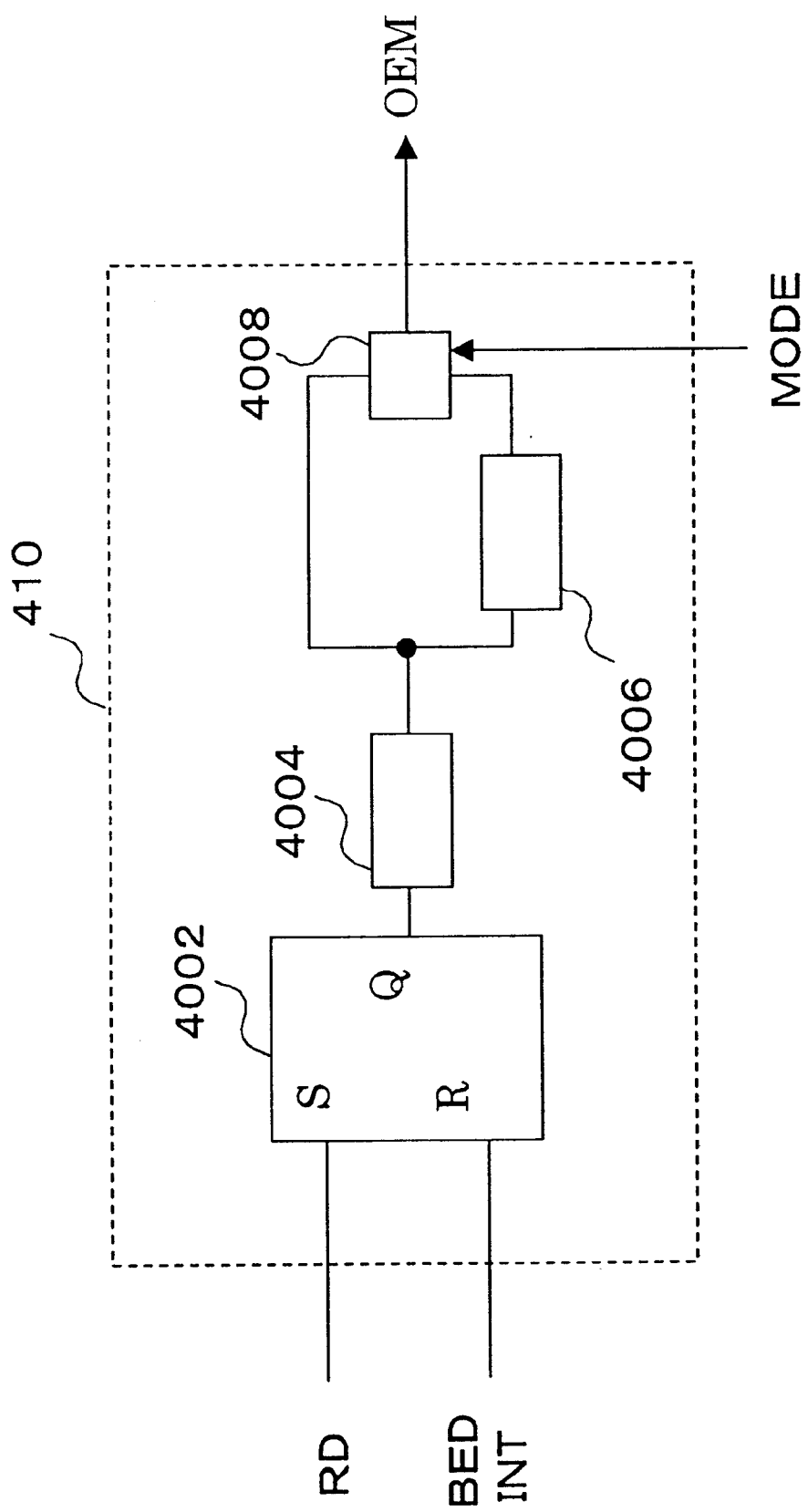
FIG. 10 is a schematic block diagram for illustrating a configuration of an output control signal generation circuit 410 shown in FIG. 8.

FIG. 10 is a schematic block diagram for illustrating a configuration of the FIG. 8 output control signal generation circuit 410.

Output control signal generation circuit 410 includes a flip-flop circuit 4002 set by read command RD and reset for example by a burst end signal BED indicating that a burst operation ends and an interrupt signal INT indicating that an interrupt service has been effected, a shift circuit 4004 receiving an output from flip-flop circuit 4002 and delaying it by one half of a clock, a shift circuit 4006 receiving an output of shift circuit 4004 and delaying it further by one clock, and a switch circuit 4008 receiving an output of shift circuit 4006 and that of shift circuit 4004 and outputting one of the outputs depending on a mode of operation.

Thus logic gate 420 receives an output of switch circuit 4008 and is controlled by inactive mask signal DM to output the output of switch circuit 4008 as signal OEM and by active mask signal DM to output a signal of a low level.

Switch circuit 4008 for the CAS latencies of one and two selects the output of shift circuit 4004 and for that of three selects the output of shift circuit 4006.

Signal OEM generation circuit 400 operates, as will be described hereinafter more specifically with reference to FIGS. 6 and 7.

As has been described previously, FIG. 6 is timing plots for illustrating a data read operation for the CAS latency of two (or three).

At time t1 clock signal CLK transitions from low to high and read command RD is applied.

Responsibly, flip-flop circuit 4002 provides an output having an active state and at time t2 clock signal CLK transitions from high to low and thereafter unless a command is issued to effect a mask operation then via switch circuit 4008 and logic gate 420 signal OEM having an active state is output.

For the CAS latency of three, signal OEM is activated one clock later of a delay time of shift circuit 4006 than the CAS latency of two. Thus the device starts outputting data at time t4 when internal clock signal CLKQ is activated.

By contrast, with reference to FIG. 7, for the CAS latency of one, at time t1 clock signal CLK transitions high and write command RD is responsively applied, and, as well as for the CAS latency of two, at time t2 clock signal CLK transitions from high to low and thereafter output control signal OEM is activated.

Thus at least output control signal generation circuit 410 generating output control signal OEM can share a configuration generating a signal for the CAS latency of one and that generating a signal for the CAS latency of two and it can thus be simplified in configuration.

Second Embodiment

The present invention in a second embodiment provides a semiconductor memory device having a main portion similar in configuration to semiconductor memory device 1000 of the first embodiment, except that memory mats 100.1 to 100.4 each operate as a bank readable and writable independently from each other. Hereinafter, memory mats 100.1 to 100.4 operate as banks #0 to #3 for the sake of illustration.

Column Interlock Operation

The semiconductor device of the second embodiment is also adapted to operate in synchronization with external clock signal CLK with clock signal CLK in a range from a relatively low frequency to a relatively high frequency.

If with clock signal CLK operating at a low rate the semiconductor memory device's operation is controlled at a timing based on a clock frequency similar to that for a rapid operation, an unnecessary operating margin would result in an unnecessarily impaired performance of the semiconductor memory device, as compared with the frequency of the clock signal of interest, as has been described previously.

Hereinafter will be described a configuration capable of maintaining high performance of an operation of a semiconductor memory device when clock signal CLK operates at relatively slow rates.

Figure 11:
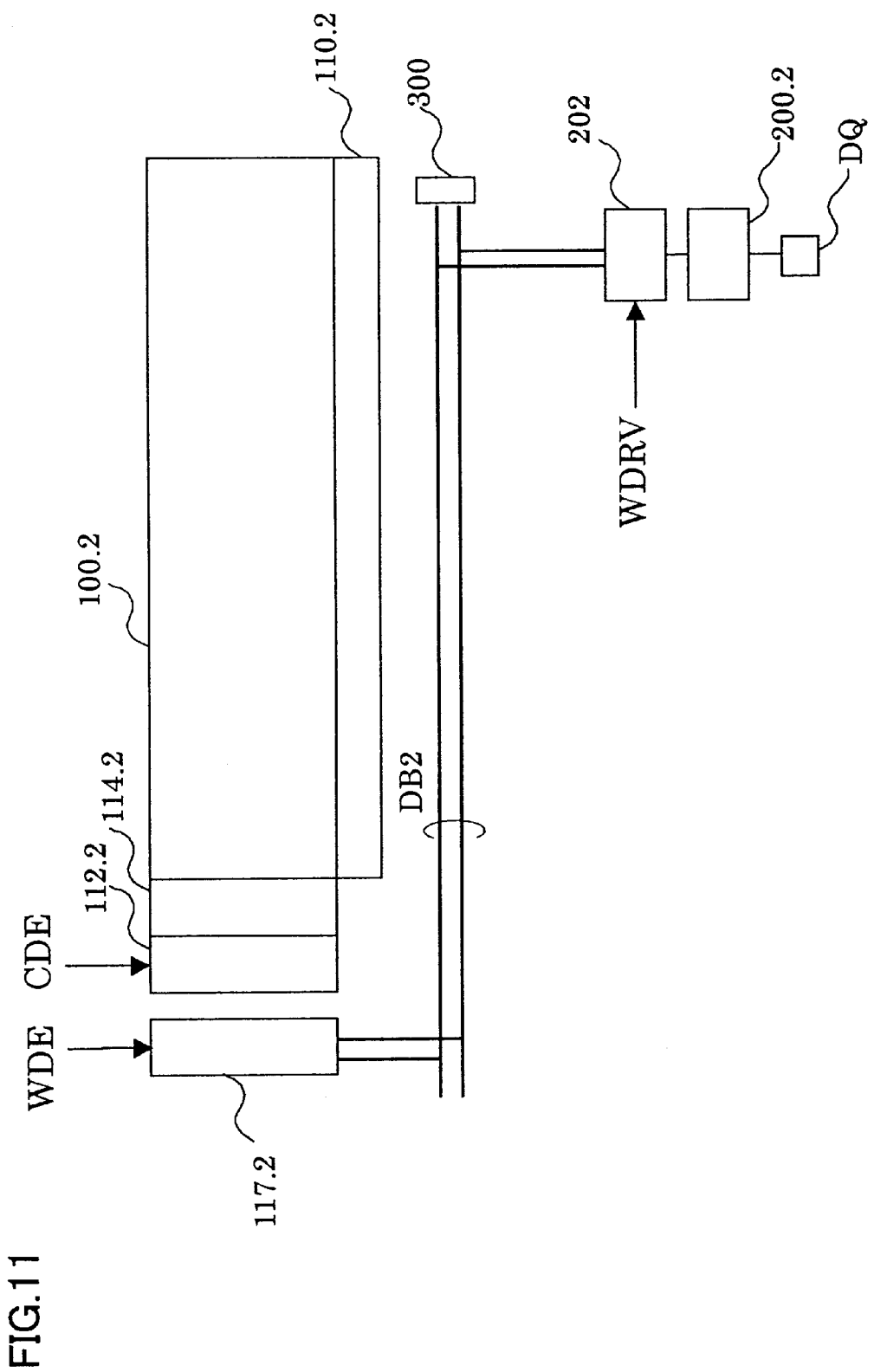
FIG. 11 is a schematic block diagram showing a configuration extracted from a configuration of a semiconductor memory device of a second embodiment of the present invention that is provided to write data to a memory bank #1.

FIG. 11 is a schematic block diagram extracting from the configuration of the semiconductor memory device of the second embodiment a configuration provided to write data to memory bank #1 (memory mat 100.2).

Data from data input/output terminal DQ is received by data input/output circuit 200.2 and furthermore a drive amplifier 202 is driven by data to be written to drive a potential of data bus DB2.

A write driver circuit 117.2 is enabled by a signal WDE received from central control circuit 20 to convert a signal of a small amplitude transmitted on data bus DB2 to a signal of a large amplitude and holds the signal and also transmit it to a memory cell column (a bit line pair) selected by a column decoder 112.2.

Herein, drive amplifier 202 is enabled by a signal WDRV output from central control circuit 20 and column decoder 112.2 is enabled by a signal CDE output from central control circuit 20.

Figure 12:
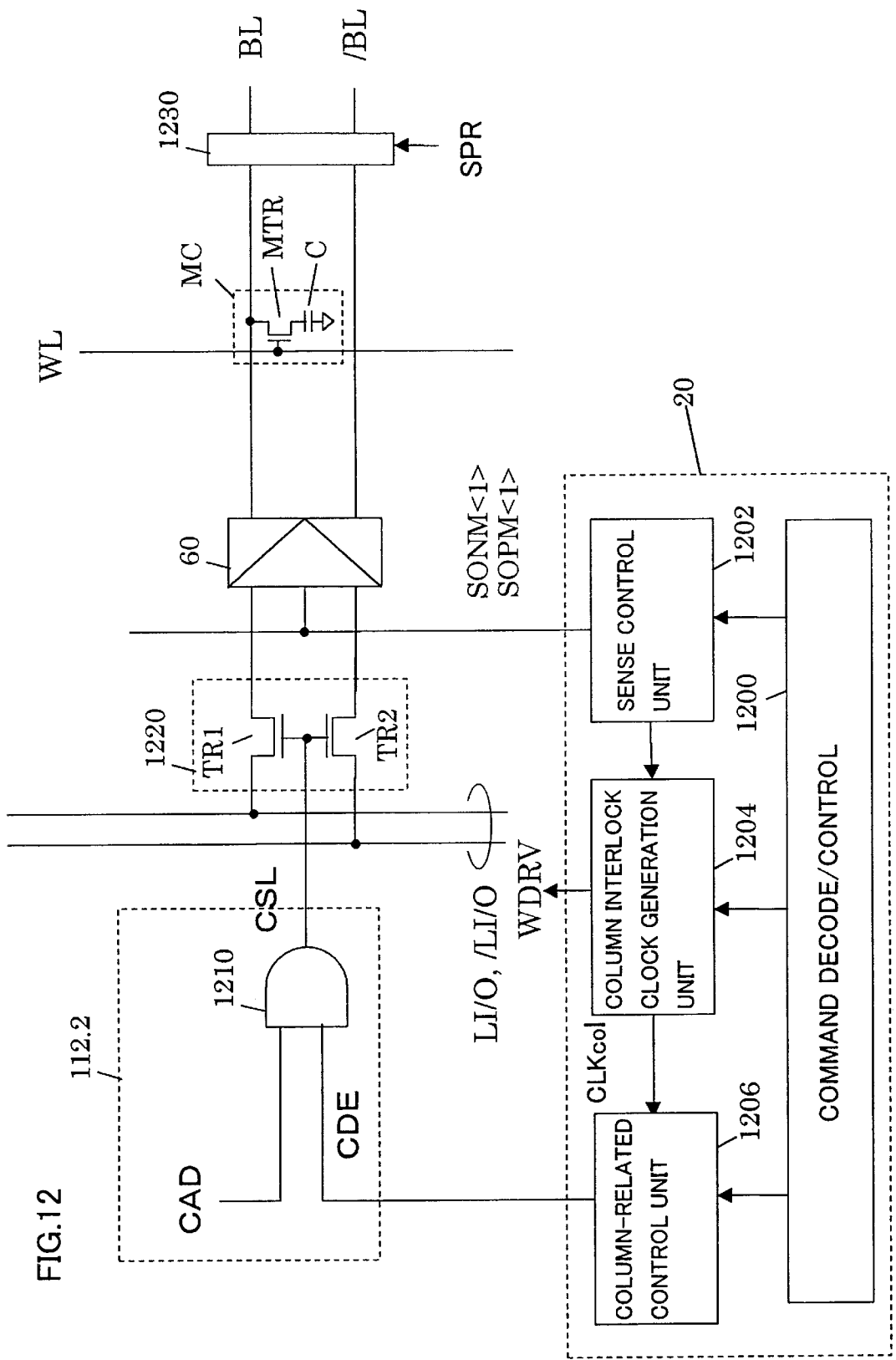
FIG. 12 is a schematic block diagram extracting and thus showing a configuration of a central control circuit 20, a column decoder 112.2 and a sense amplifier/select gate circuit 114.1 for bank #1.

FIG. 12 is a schematic block diagram showing an extracted configuration of central control circuit 20 and column decoder 112.2 and sense amplifier/select gate circuit 114.1 for bank #1.

As shown in FIG. 12, central control circuit 20 includes a command decode/control unit 1200 receiving an input from control signal input terminal group 10 to generate an internal command signal, a sense control unit 1202 receiving an output from command decode/control unit 1200 and outputting signals SONM<1> and SOPM<1> controlling an operation of sense amplifier 60, a column interlock clock generation unit 1204 operative in response to an output of sense control unit 1202 to generate a clock signal CLKcol column-interlock-controlled, as will be described hereinafter, and a signal EDRV controlling an operation of drive amplifier 202 in a write operation, and a column-related control unit 1206 controlled by command decode/control unit 1200, operative in response to signal CLKcol to output a column decode enable signal CDE.

Column decoder 112.2 includes a decoder 1210 receiving a column address decode signal CAD generated in response to an address signal and signal CDE from central control unit 20 to output a signal CSL selecting a memory cell column selected in bank #1.

Bank #1 is provided with a pair of bit lines BL and /BL and a word line WL selected by row decoder 110.2 and bit line BL have their intersection provided with a memory cell MC including a memory cell transistor MTR and a memory cell capacitor C.

Data stored in memory cell MC is read on bit line BL in response to word line WL attaining the active state and the data is amplified by sense amplifier 60 enabled by enable signals SONM<1> and SOPM<1>.

The data amplified by sense amplifier 60 is transmitted on bit line pair BL and /BL and read onto an I/O line pair LI/O and /LI/O when signal CSL selects an I/O gate 1220 and therein turns on transistors TR1 and TR2. I/O line pair LI/O and /LI/O transmits the data for example to data bus DB2.

Furthermore for bit line pair BL and /BL there is provided a precharge circuit 1230 operative in response to a signal SPR output from central control circuit 20 to equalize a potential of bit line pair BL and /BL to precharge it to attain a predetermined potential.

Figure 13:
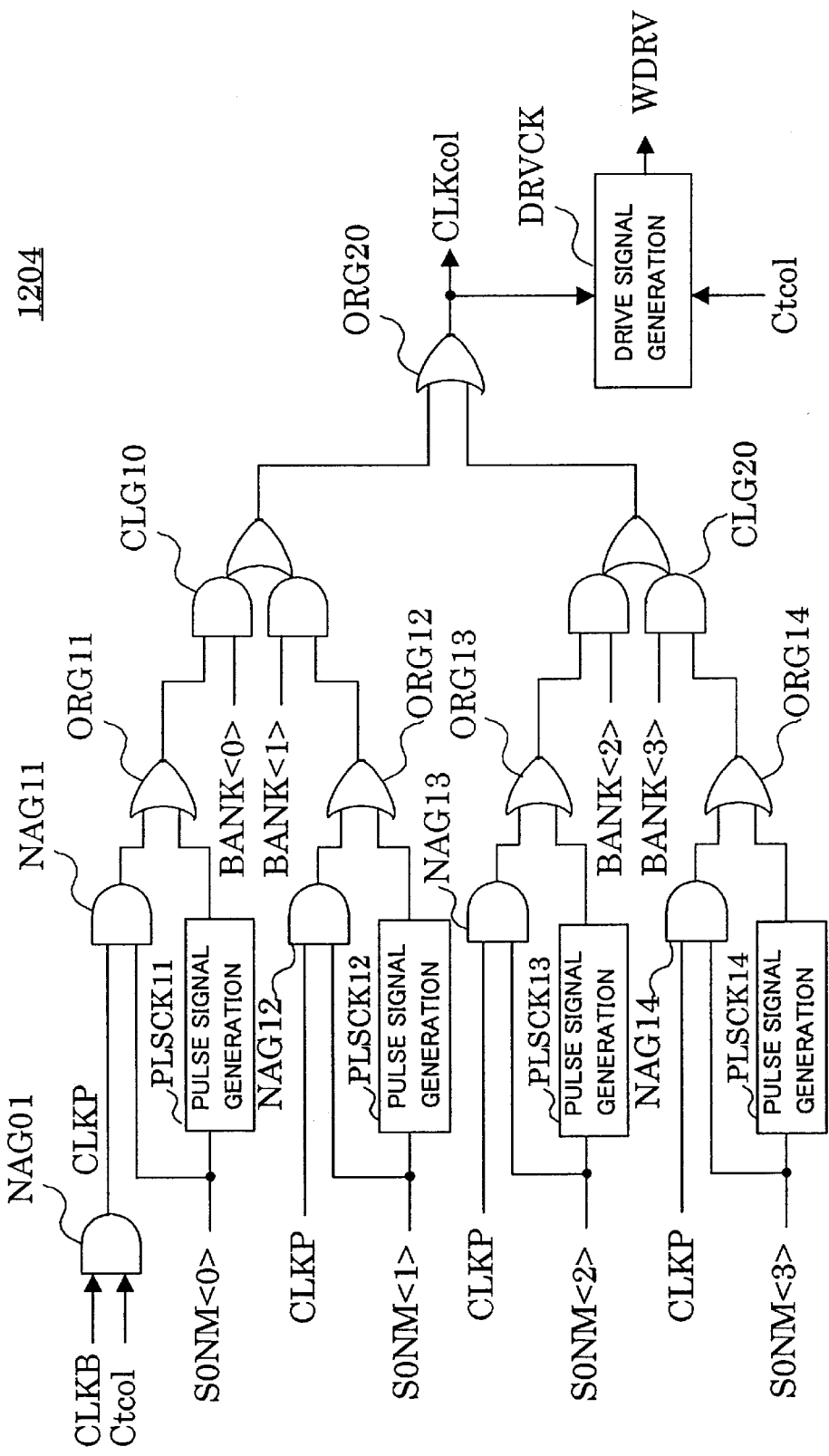
FIG. 13 a block diagram schematically showing a configuration of a column interlock clock generation unit 1204 shown in FIG. 12.

FIG. 13 is a schematic block diagram showing a configuration of the FIG. 12 column interlock clock generation unit 1204.

As shown in FIG. 13, column interlock clock generation unit 1204 includes an AND circuit NAGO1 receiving an internal control signal Ctcol activated in response to a command ACT and an internal clock signal CLKB generated in synchronization with an external clock signal, performing an AND operation thereon and outputting the result of the operation as a clock signal CLKP.

As will be described hereinafter, clock signal CLKB is an inverted version of internal clock signal CLKQ described in the first embodiment.

Column interlock clock generation unit 1204 also includes an AND circuit NAG11 receiving internal clock signal CLKP and a sense signal SONM<0> indicative of an instruction to enable a sense amplifier of bank #0, a pulse signal generation circuit PLSCK11 receiving signal SONM<0>to generate a signal pulsing at predetermined temporal intervals, and an OR circuit ORG11 receiving an output of AND circuit NAG11 and that of pulse signal generation circuit PSLCK11.

Column interlock clock generation unit 1204 also includes an AND circuit NAG 12 receiving internal clock signal CLKP and sense signal SONM<1> indicative of an instruction to enable a sense amplifier of bank#1, a pulse signal generation circuit PLSCK12 receiving signal SONM<l> to generate a signal pulsing at intervals of a predetermined period of time, and an OR circuit ORG12 receiving an output of AND circuit NAG12 and that of pulse signal generation circuit PLSCK12.

Column interlock clock generation unit 1204 also includes a composite logic gate CKG10 outputting a logical sum of a logical product of a bank select signal BANK<0> indicating that bank#0 is selected and an output of OR circuit ORG12 and a logical product of a bank select signal BANK<1> indicating that bank#1 is selected and an output of OR circuit ORG12.

Column interlock clock generation unit 1204 also includes an AND circuit NAG 13 receiving internal clock signal CLKP and sense signal SONM<2> indicative of an instruction to enable a sense amplifier of bank#2, a pulse signal generation circuit PLSCK13 receiving signal SONM<2> to generate a signal pulsing at intervals of a predetermined period of time, and an OR circuit ORG13 receiving an output of AND circuit NAG13 and that of pulse signal generation circuit PLSCK13.

Column interlock clock generation unit 1204 also includes an AND circuit NAG14 receiving internal clock signal CLKP and sense signal SONM<3> indicative of an instruction to enable a sense amplifier of bank#3, a pulse signal generation circuit PLSCK14 receiving signal SONM<3> to generate a signal pulsing at intervals of a predetermined period of time, and an OR circuit ORG14 receiving an output of AND circuit NAG14 and that of pulse signal generation circuit PLSCK14.

Column interlock clock generation unit 1204 also includes a composite logic gate CKG20 outputting a logical sum of a logical product of a bank select signal BANK<2> indicating that bank#2 is selected and an output of OR circuit ORG13 and a logical product of a bank select signal BANK<3> indicating that bank#3 is selected and an output of OR circuit ORG14.

Column interlock clock generation unit 1204 also includes an OR circuit ORG20 obtaining a logical sum of an output of composite logic gate CKG10 and that of composite logic gate CKG10 and outputting signal CLKcol, and a drive signal generation circuit DRVCK receiving signal CLKcol to generate a signal EDRV.

Figure 14:
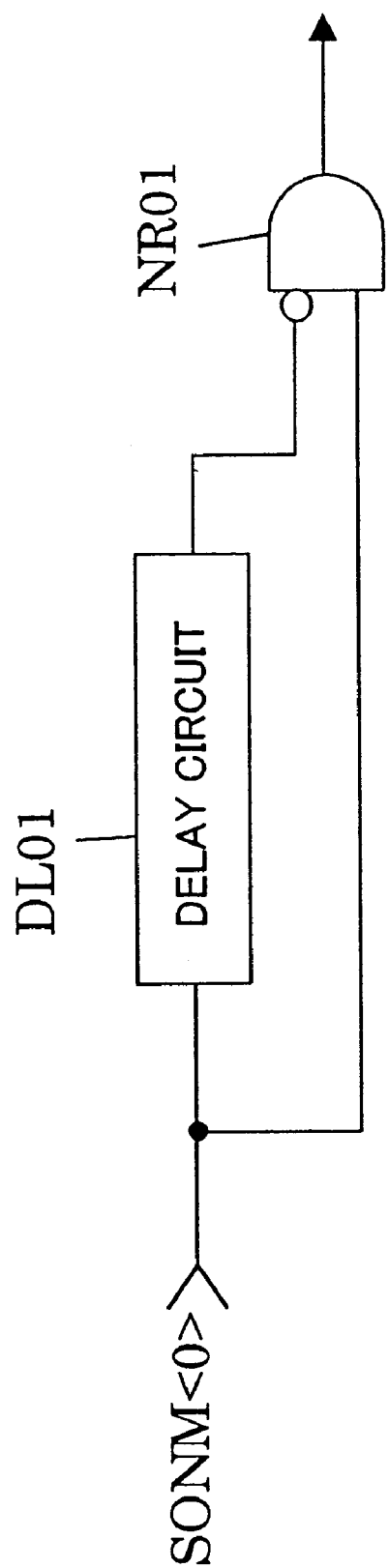
FIG. 14 is a circuit diagram for illustrating a configuration of a pulse signal generation circuit PLUCK shown in FIG. 13.

FIG. 14 is a circuit diagram for illustrating a configuration of the FIG. 13 pulse signal generation circuit PLSCK11. Note that the configuration similarly applies to each of the other pulse signal generation circuits PLSCK12 to PLSCK14.

As shown in FIG. 14, pulse signal generation circuit PLSCK12 includes a delay circuit DL01 receiving signal SONM<0> and delaying it for a predetermined period of time, and a logic gate NR01 outputting a logical product of an inverted level of an output of delay circuit DL01 and signal SONM<0>.

Figure 15:
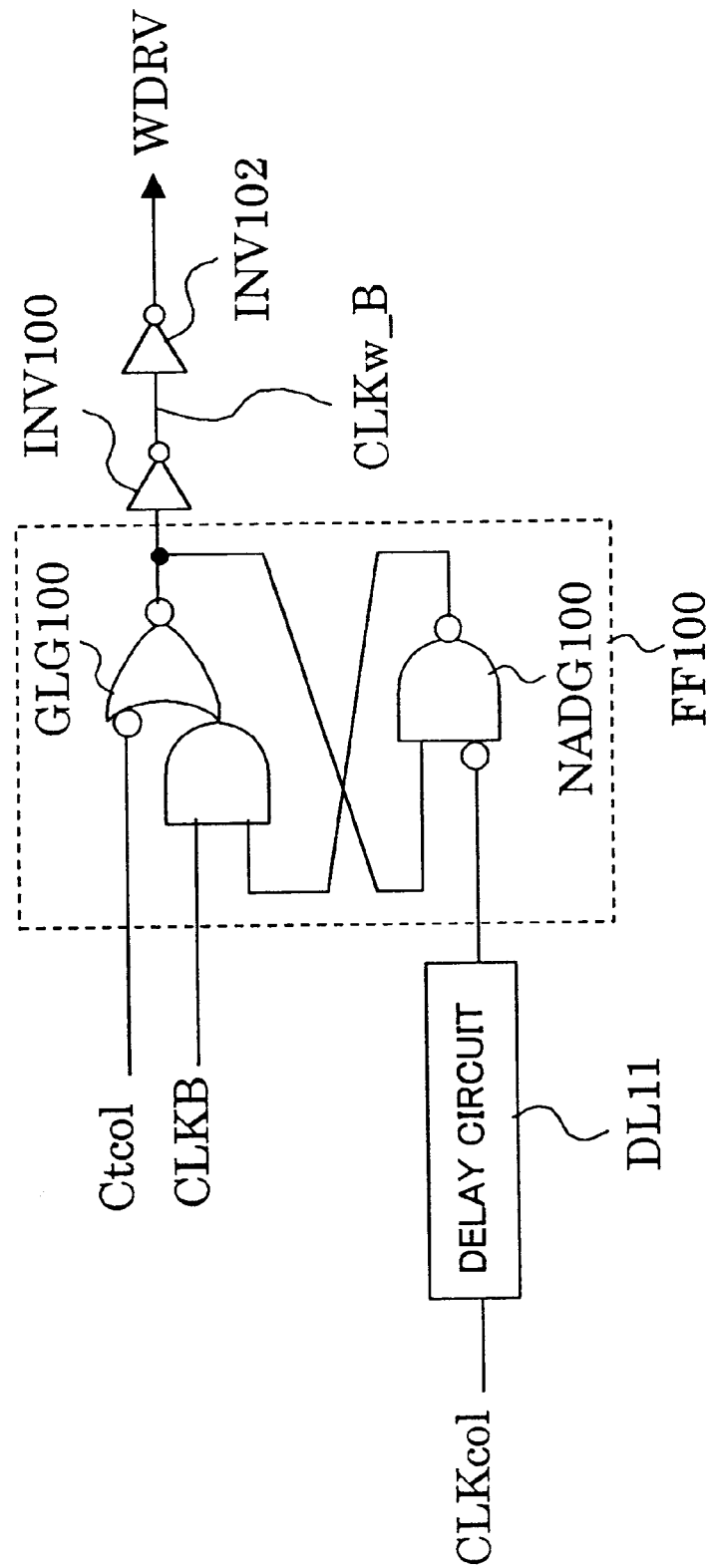
FIG. 15 is a circuit diagram showing a configuration of a drive signal generation circuit DRVCK in the FIG. 13 configuration.

FIG. 15 is a circuit diagram showing a configuration of drive signal generation circuit DRVCK in the FIG. 13 configuration.

As shown in FIG. 15, drive signal generation circuit DRVCK includes a delay circuit DL11 receiving signal CLKcol and delaying it for a predetermined period of time, a flip-flop circuit FF100 set by signal CLKB with signal Ctcol having an active state, and reset by an output of delay circuit DL11, an inverter INV100 inverting an output of flip-flop FF100 to output a signal CLKw_B, and an inverter INV102 inverting an output of inverter INV100 to output a drive signal WDRV.

Flip-flop circuit FF100 includes an AND circuit NADG100 having one input receiving an inverted version of the output of delay circuit DL11, and a composite logic gate CLG100 outputting to inverter INV100 the negative OR of the logical product of an output of AND circuit NADG100 and signal CLKB, and an inverted version of signal Ctcol.

Figure 16:
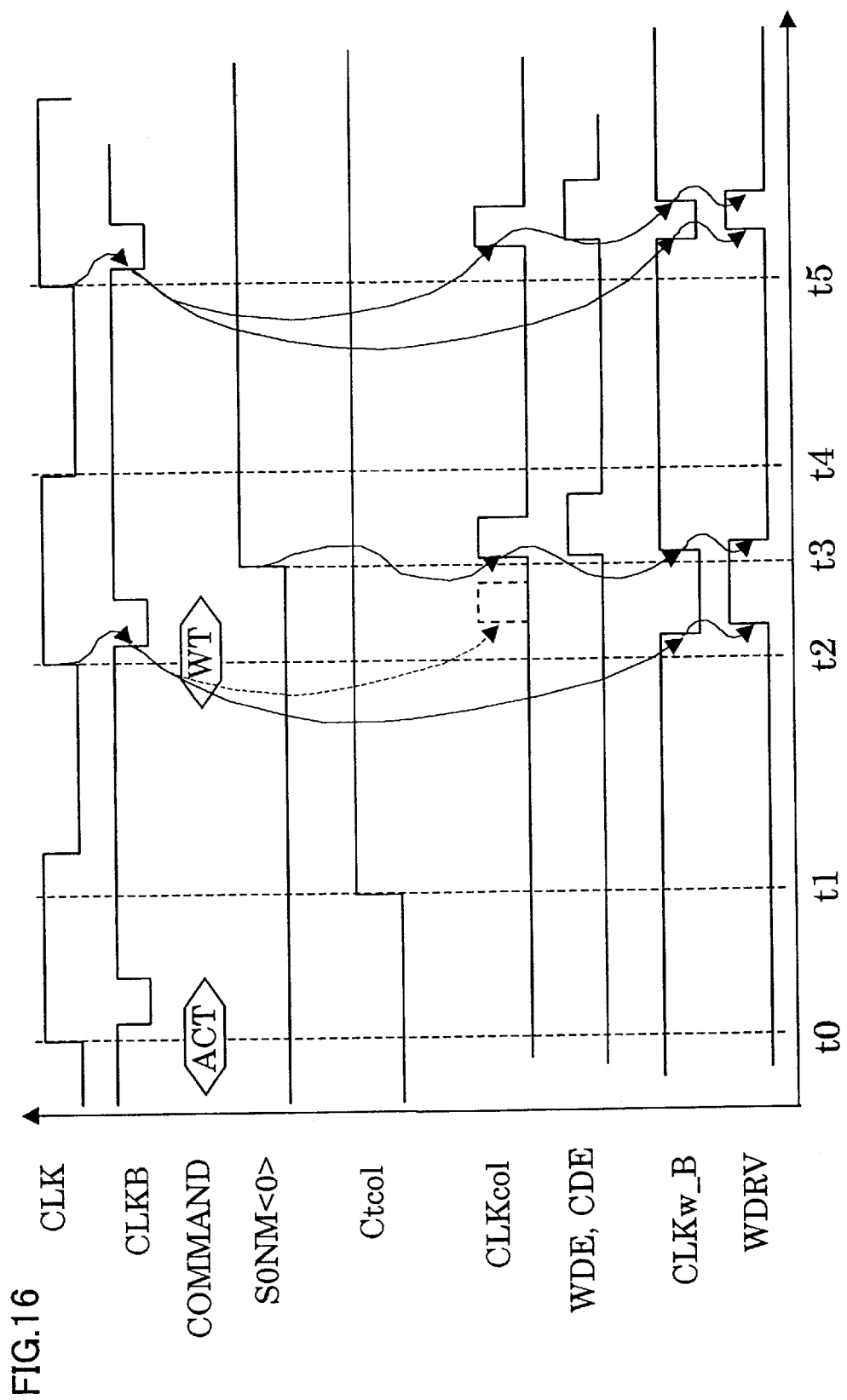
FIG. 16 is timing plots for illustrating an operation of column interlock clock generation unit 1204.
Figure 17:
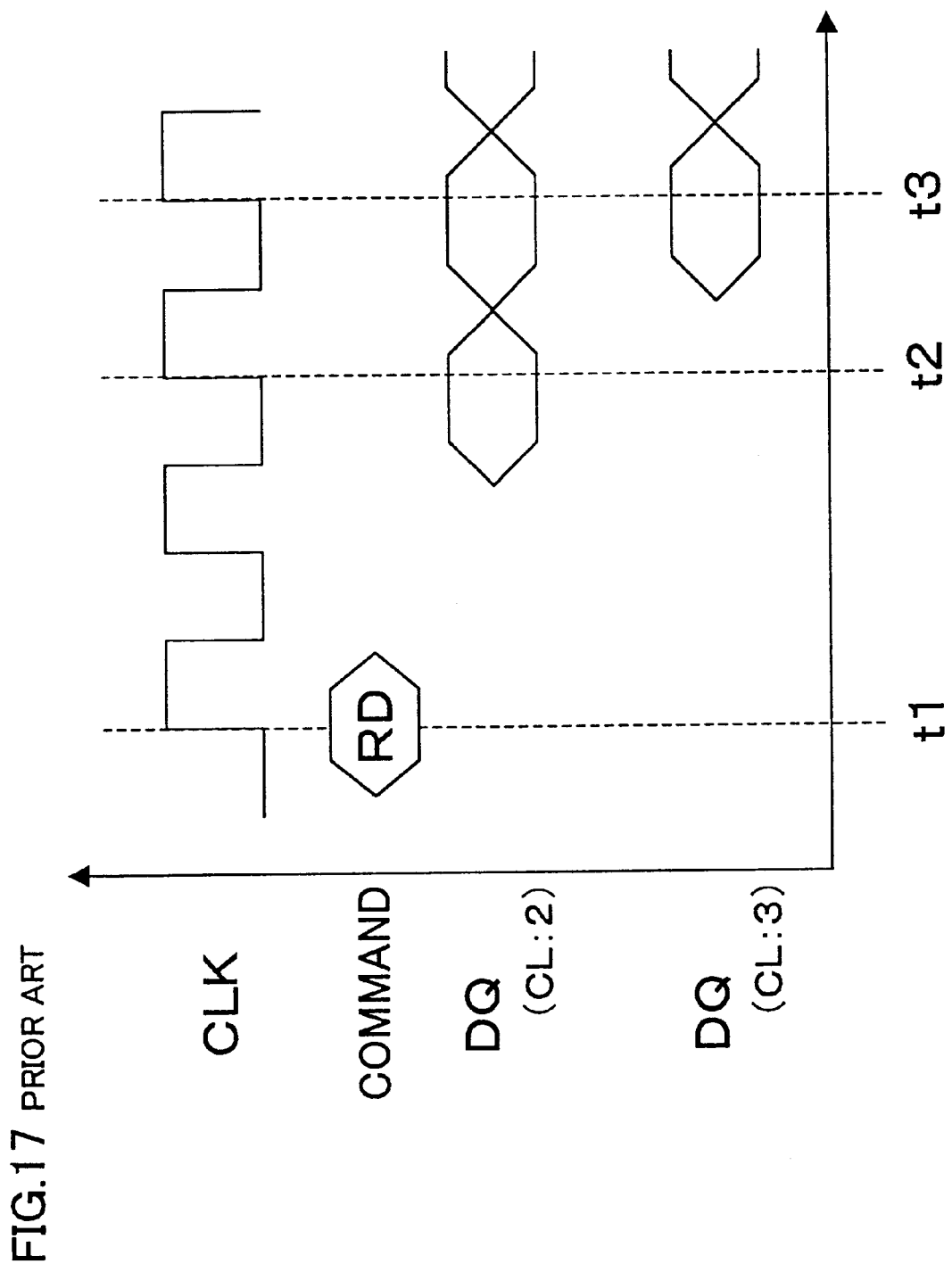
FIG. 17 is timing plots for illustrating a read operation of a conventional synchronous semiconductor memory device.
Figure 18:
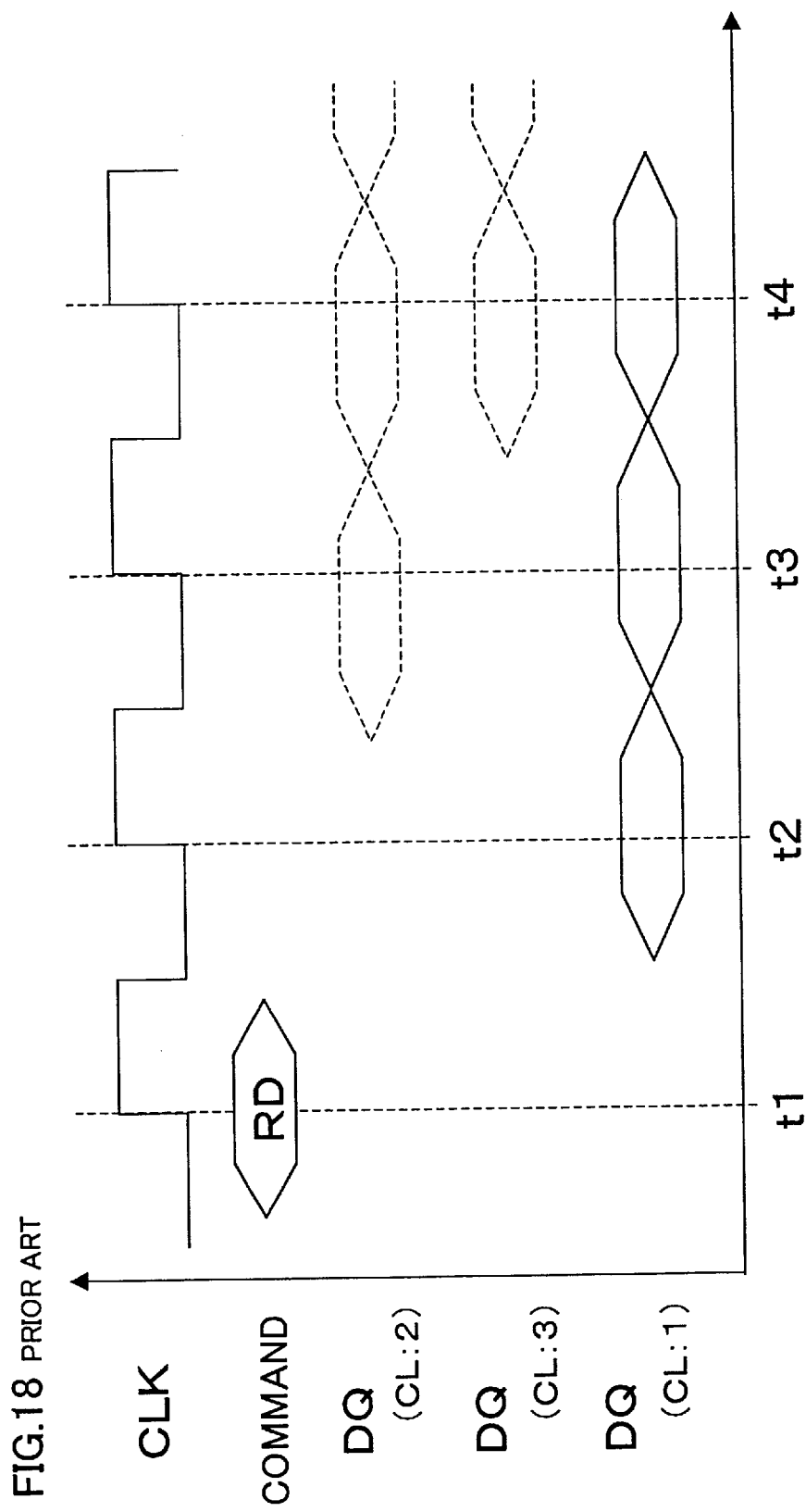
FIG. 18 represents an operation in waveform of a synchronous semiconductor memory device when it is operated in synchronization with a slower clock signal CLK.

FIG. 16 is timing plots for illustrating an operation of column interlock clock generation unit 1204 described with reference to FIGS. 12–15.

Hereinafter the semiconductor memory device of the second embodiment is assumed to be a synchronous SDRAM for the sake of illustration. An SDRAM requires that command ACT and read or write command RD/WT be provided with a value defined by a time tRCD therebetween.

For example, if time tRCD has a specification value of 20 ns and clock signal CLK has a frequency of 100 MHz then tRCD=2×CLK for example. Thus, time tRCD is defined by the period of clock signal CLK.

If time tRCD is defined as described above and for example a CAS latency of two and an operating frequency of 66 MHz are applied, however, time tRCD of one clock (up to 15 ns) would be violate its specification and to satisfy the specification value of 20 ns time tRCD=2×CLK (up to 30 ns) needs to be set. In other words, while time tRCD has a specification value of 20 ns, a delay of an unnecessary period of approximately 10 ns is introduced in an operation.

If after command RD/WT is input there is a margin of a timing in a margin of a read or write operation in the SDRAM portion, however, an operation related to time tRCD, i.e., an operation of a sense amplifier and writing data from I/O line pair LI/O, LI/O can be timed, as appropriately adjusted, to maintain time tRCD of one clock for an operating frequency for example of 66 MHz.

In other words, if signal CLKcol described in FIG. 13 is timed, as adjusted, the SDRAM operation can achieve high performance, as will be described hereinafter.

With reference to FIG. 16, at time t0 clock signal CLK is activated, when command ACT is input.

Responsively at time t1 internal control signal Ctcol attains an active state.

Subsequently, time t0 with clock signal CLK activated is followed by one clock and time t2 is thus arrived at when command WT is issued, and in response thereto sense control unit 1202 at time t3 drives sense amplifier enable signal SONM<0> for bank#0 high to enable a sense amplifier.

Herein, normally, clock signal CLKcol is generated by internal clock signal CLKB generated in response to clock signal CLK transitioning at time t2 for activation. In response to clock signal CLKcol, column decode enable signal CDE enabling an operation to select a memory cell column and signal WDE are activated.

If in FIG. 16 clock signal CLK has a period slightly smaller than a specification value of time tRCD and column decode enable signal CDE is activated at a timing as described above, however, bit line pair BL, /BL would be coupled with an I/O line pair before a sense amplifier starts a sense operation.

Accordingly, column interlock clock generation unit 1204 does not activate column decode signal CDE before time t3 is arrived at when sense amplifier enable signal SONM<0> has a transition for activation. In response to column decode signal CDE thus activated, column decoder enable signal CDE is activated.

In other words, if a timing at which column decode enable signal CDE is activated does not respond to sense amplifier enable signal SON attaining an active state, then before sense amplifier 60 provides an amplifying operation select signal CSL would be activated and bit line pair BL, /BL and I/O line pair LI/O, LO/O would be connected together and data might be destroyed.

Meanwhile, signal WDRV is activated by internal clock signal CLKB generated in response to CLK transitioning at time t2 for activation. Thus data bus DB has a potential driven by drive amplifier 202.

Signal WDRV is inactivated in response to clock signal CLKcol attaining an active state. Thus the data bus has its potential maintained in a driven state by drive amplifier 202 until signal CDE is activated and bit line pair BL, /BL and I/O line pair LI/O, /LO/O are connected together.

From time t5 on, clock signal CLKcol is generated by internal clock signal CLKB generated in response to clock signal CLK transitioning for activation. In response to clock signal CLKcol, column decode enable signal CDE is activated to enable an operation selecting a memory cell column. Also from time t5 on, signal WDRV is activated by internal clock signal CLKB generated in response to CLK transitioning for activation and it is inactivated in response to clock signal CLKcol attaining an active state.

Thus an SDRAM operating with a clock frequency reduced does not require a writing rate and the like delayed more than required and it can thus achieve high performance.

While the above mainly describes a timing at which column decode enable signal CDE is activated in writing data, column decode enable signal CDE can also be activated in reading data when sense signals SONM<0> to SONM<3> have an active state and read command RD is also applied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device synchronized with an external clock signal to input a command and input and output data, comprising:
    a control circuit controlling an operation of said semiconductor memory device;
    a memory cell array including a plurality of memory cells arranged in rows and columns;
    an internal clock circuit operative in response to said external clock signal to generate an internal clock signal;
    a clock signal line transmitting said internal clock signal;
    a clock conversion circuit receiving said internal clock signal on said clock signal line and selectively outputting one of first and second clock signals based on said internal clock signal depending on which one of first and second modes of operation is designated, said first mode of operation allowing starting reading data from said memory cell array one clock after a read command is applied when said external clock signal has a first transition for activation, said second mode of operation allowing starting reading data from said memory cell array two clocks after said read command is applied when said external clock signal has said first transition for activation, said second clock signal in said second mode of operation being equal in frequency to said external clock and being synchronized with said external clock, said first clock signal in first mode of operation pulsing twice for activation within a period of said internal clock signal;
    a data bus transmitting data read from said memory cell array;
    an equalization circuit operative in response to an equalization signal to equalize said data bus;
    a command signal line transmitting said equalization signal from said control circuit;
    a data input/output terminal; and
    an input/output circuit outputting to said data input/output terminal the read data transmitted on said data bus, said input/output circuit including a latch circuit operative in said second mode of operation to store and hold said read data therein in response to said second clock signal attaining an active state, and operative in said first mode of operation to store and hold said read data therein in response to said first clock signal and said equalization signal each attaining an active state.

2. The semiconductor memory device of claim 1, said control circuit generating an output enable signal in response to said read command, said input/output circuit outputting data to said data input/output terminal in response to said output enable signal attaining an active state, said semiconductor memory device further comprising:
    a command input terminal receiving a data mask signal;
    an input buffer receiving said data mask signal from said command input terminal;
    a first delay circuit delaying a signal received from said input buffer, by one clock of said external clock signal;
    a switch circuit receiving a signal from said input buffer and an output of said first delay circuit and selecting said output of said first delay circuit in said first mode of operation and selecting said signal received from said input buffer in said second mode of operation; and
    an output disable circuit compulsorily inactivating said output enable signal in response to said switch circuit outputting a signal having an active state.

3. The semiconductor memory device of claim 2, further comprising means operative in response to a write command to disable transmitting a signal from said input buffer to said first delay circuit.

4. The semiconductor memory device of claim 2, wherein:
said control circuit includes an output control signal generation circuit generating an output enable signal in response to said read command; and
in said first mode operation and said second mode of operation when an instruction is issued to read data two clocks after said first transition for activation, a common timing is applied to allow said output control signal generation circuit to activate said output enable signal.

5. The semiconductor memory device of claim 1, wherein:
said memory cell array includes a plurality of bit lines each provided to correspond to said column of memory cells to transmit data from a corresponding memory cell, a plurality of sense amplifiers enabled by a sense amplifier enable signal to amplify a potential of said bit line, and a column select circuit enabled by a column select enable signal to select said column of memory cells selected in response to an external address signal; and
said control circuit activates said column select enable signal in response to one of external read and write commands being applied said sense amplifier enable signal also having an active state.

6. The semiconductor memory device of claim 5, further comprising:
a drive amplifier circuit enabled by a write drive signal to drive a potential of said data bus in response to data to be written output from said input/output circuit; and
a write driver circuit transmitting to said column of memory cells selected a signal transmitted on said data bus,
wherein said control circuit enables said write driver circuit together with said column select enable signal attaining an active state, and said control circuit also activates said write drive signal in response to said external clock signal attaining an active state and inactivates said write drive signal in response to said column select enable signal attaining the inactive state.

7. The semiconductor memory device of claim 1, wherein:
said memory cell array is divided in a plurality of banks, each including a plurality of bit lines each corresponding to said column of memory cells to transmit data from a corresponding memory cell, a plurality of sense amplifiers enabled by a sense amplifier enable signal to amplify a potential of said bit line, and a column select circuit enabled by a column select enable signal to select said column of memory cells selected in response to an external address signal; and
when one of external read/write commands is applied, said sense amplifier enable signal has an active state and said bank is selected in response to an address signal, said control circuit activates said column select enable signal corresponding to said bank selected.

8. The semiconductor memory device of claim 7, further comprising:
a drive amplifier circuit enabled by a write drive signal to drive a potential of said data bus in response to data to be written output from said input/output circuit; and
a write driver circuit transmitting to said column of memory cells selected a signal transmitted on said data bus,
wherein said control circuit enables said write driver circuit together with said column select enable signal attaining the active state, and said control circuit also activates said write drive signal in response to said external clock signal attaining the active state and inactivates said write drive signal in response to said column select enable signal attaining the inactive state.

* * * * *